(12) United States Patent
Ohira et al.

(10) Patent No.: US 10,103,514 B2
(45) Date of Patent: Oct. 16, 2018

(54) OPTICAL SEMICONDUCTOR DEVICE AND METHOD FOR MANUFACTURING THE SAME

(71) Applicant: KABUSHIKI KAISHA TOSHIBA, Minato-ku (JP)

(72) Inventors: Kazuya Ohira, Tokyo (JP); Mizunori Ezaki, Yokohama (JP); Hirotaka Uemura, Kawasaki (JP); Haruhiko Yoshida, Funabashi (JP); Norio Ilzuka, Kawasaki (JP); Hideto Furuyama, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/069,478

(22) Filed: Mar. 14, 2016

(65) Prior Publication Data
US 2016/0276806 A1  Sep. 22, 2016

(30) Foreign Application Priority Data

Mar. 20, 2015  (JP) .................................. 2015-058197
Mar. 11, 2016  (JP) .................................. 2016-048033

(51) Int. Cl.
*H01S 5/00* (2006.01)
*H01S 3/08* (2006.01)
(Continued)

(52) U.S. Cl.
CPC ........ *H01S 5/18361* (2013.01); *H01S 3/1055* (2013.01); *H01S 5/02461* (2013.01);
(Continued)

(58) Field of Classification Search
CPC ............... H01S 5/18361; H01S 3/1055; H01S 5/18369; H01S 5/02461; H01S 5/105;
(Continued)

(56) References Cited

U.S. PATENT DOCUMENTS 6,810,064 B1 * 10/2004 Coldren ................. B82Y 20/00
                                                 372/46.01
6,980,577 B1 * 12/2005 Francis .................. B82Y 20/00
                                                 372/107
(Continued)

FOREIGN PATENT DOCUMENTS

JP  2000-312055 A  11/2000
JP  2006-332595 A  12/2006
(Continued)

OTHER PUBLICATIONS

C. Sciancalepore, et al., "Thermal, Modal, and Polarization Features of Double Photonic Crystal Vertical-Cavity Surface-Emitting Lasers" IEEE Photonics Journal, vol. 4, No. 2, Apr. 2012, pp. 399-410.
(Continued)

*Primary Examiner* — Yuanda Zhang
(74) *Attorney, Agent, or Firm* — Oblon, McClelland, Maier & Neustadt, L.L.P.

(57) ABSTRACT

A semiconductor light-emitting device according to one embodiment includes a substrate, a first light reflection structure provided in contact with the substrate, a buried layer surrounding the first light reflection structure, an optical semiconductor structure including an active layer, provided above the first light reflection structure, a second light reflection structure provided above the optical semiconductor structure, and a pair of electrodes which supply current to the optical semiconductor structure. The surface of the first light reflection structure and the surface of the buried layer are included in the same plane.

16 Claims, 18 Drawing Sheets

(51) Int. Cl.
  *H01S 5/183* (2006.01)
  *H01S 5/042* (2006.01)
  *H01S 3/1055* (2006.01)
  *H01S 5/024* (2006.01)
  *H01S 5/10* (2006.01)
  *H01S 5/02* (2006.01)
  *H01S 5/343* (2006.01)

(52) U.S. Cl.
  CPC ............ *H01S 5/0425* (2013.01); *H01S 5/105* (2013.01); *H01S 5/18369* (2013.01); *H01S 5/0217* (2013.01); *H01S 5/18305* (2013.01); *H01S 5/18352* (2013.01); *H01S 5/34306* (2013.01)

(58) Field of Classification Search
  CPC ............... H01S 5/0425; H01S 5/34306; H01S 5/18352; H01S 5/18305; H01S 5/0217
  See application file for complete search history.

(56) References Cited

U.S. PATENT DOCUMENTS

2005/0243890 A1* 11/2005 Kim ...................... B82Y 20/00
                                                     372/99
2006/0245464 A1    11/2006 Hori et al.
2007/0036189 A1     2/2007 Hori et al.
2007/0121694 A1     5/2007 Okamoto
2008/0298419 A1* 12/2008 Hori ........................ H01S 5/183
                                                     372/50.124
2012/0008658 A1*  1/2012 Chung .................... H01S 5/10
                                                     372/45.01
2015/0288146 A1* 10/2015 Chang-Hasnain ...... H01S 5/021
                                                     372/50.11

FOREIGN PATENT DOCUMENTS

JP          4027392 B2    12/2007
JP       2012-49292 A      3/2012

OTHER PUBLICATIONS

D. Zhao, et al. "Design of Photonic Crystal Membrane-Reflector-Based VCSELs" IEEE Photonics Journal, vol. 4, No. 6, Dec. 2012, pp. 2169-2175.

* cited by examiner

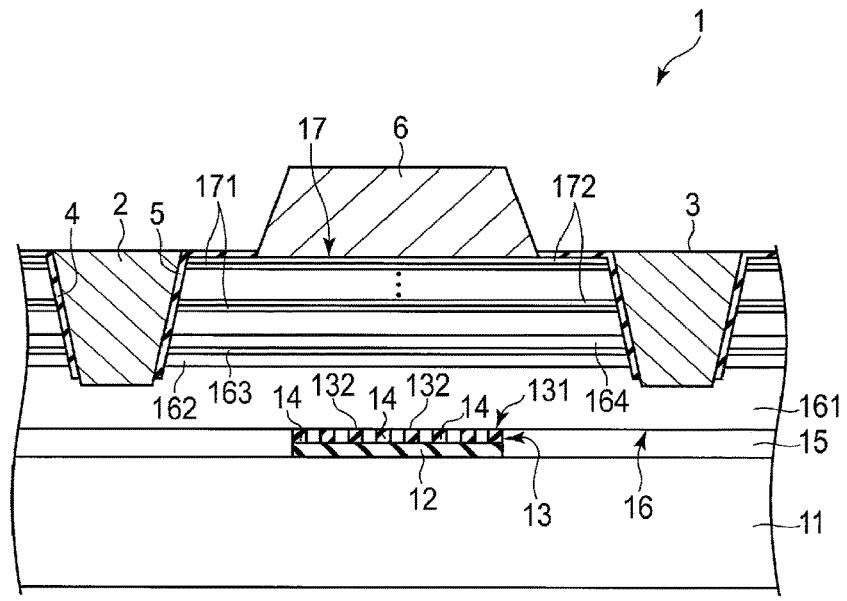
F I G. 1
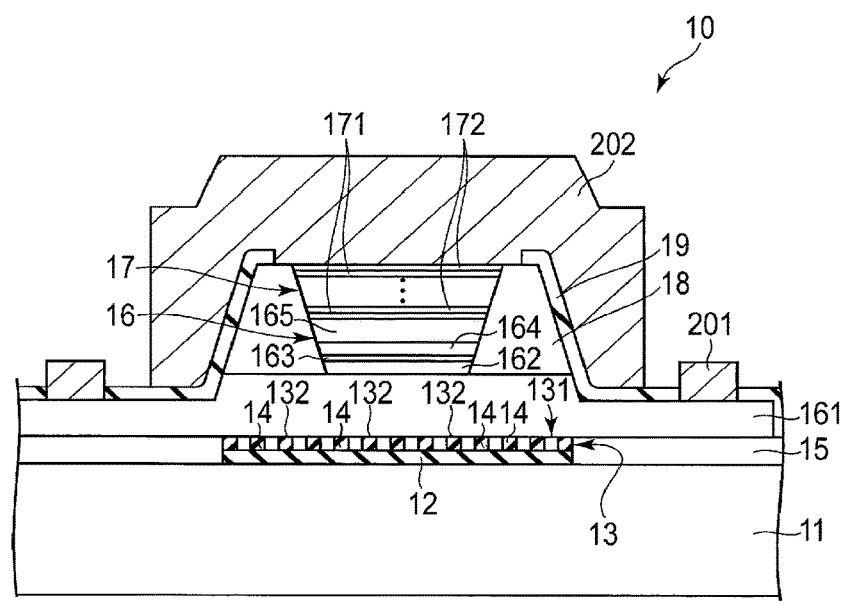
F I G. 2

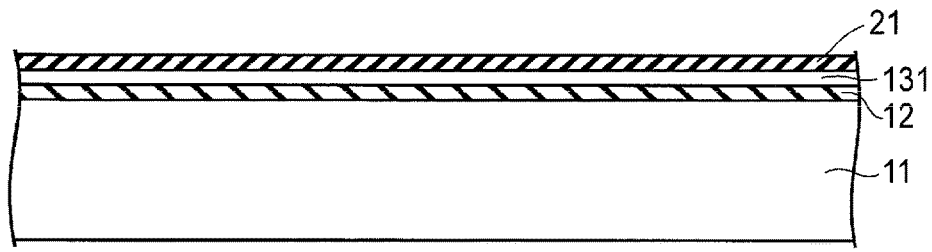
F I G. 3A
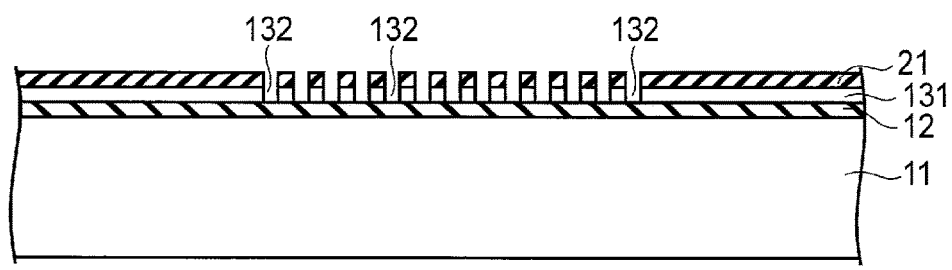
F I G. 3B
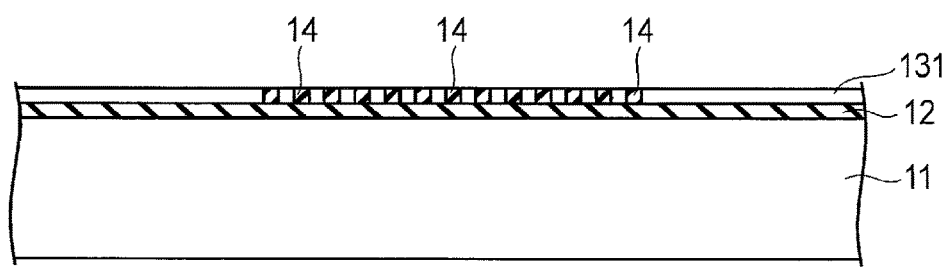
F I G. 3C

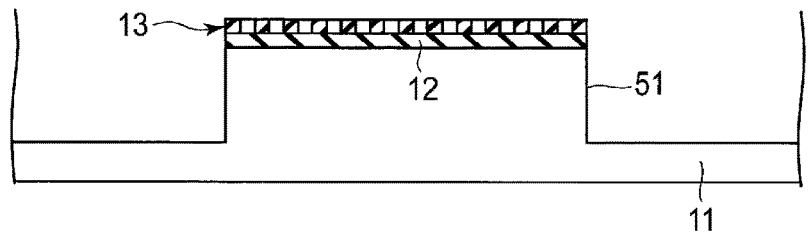
F I G. 6A
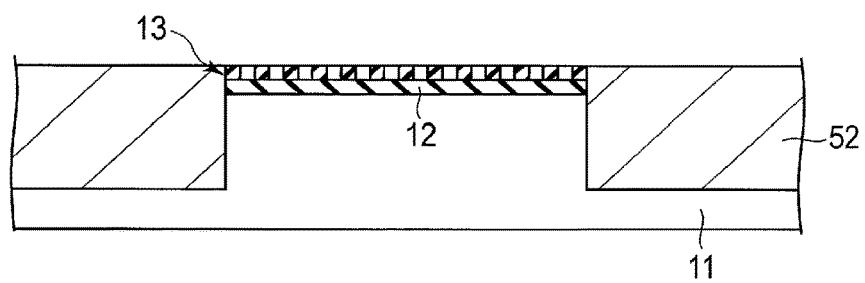
F I G. 6B
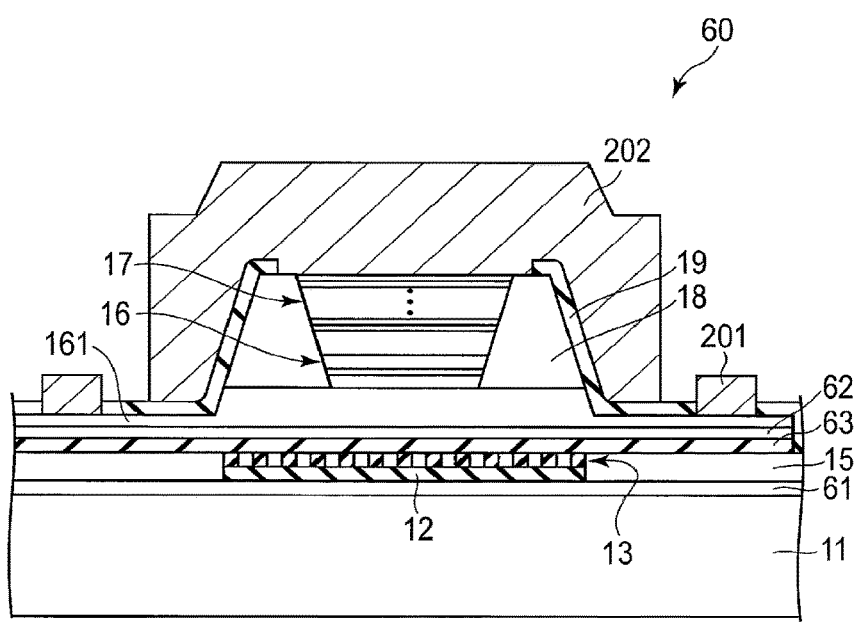
F I G. 7

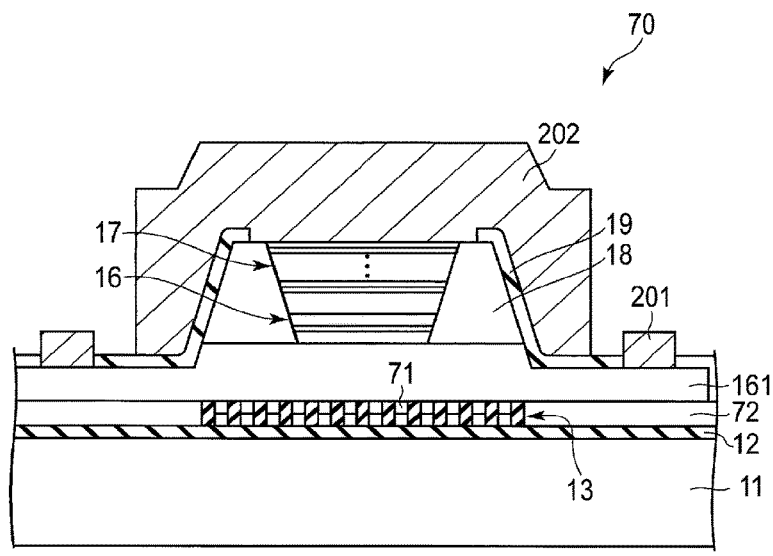
F I G. 8
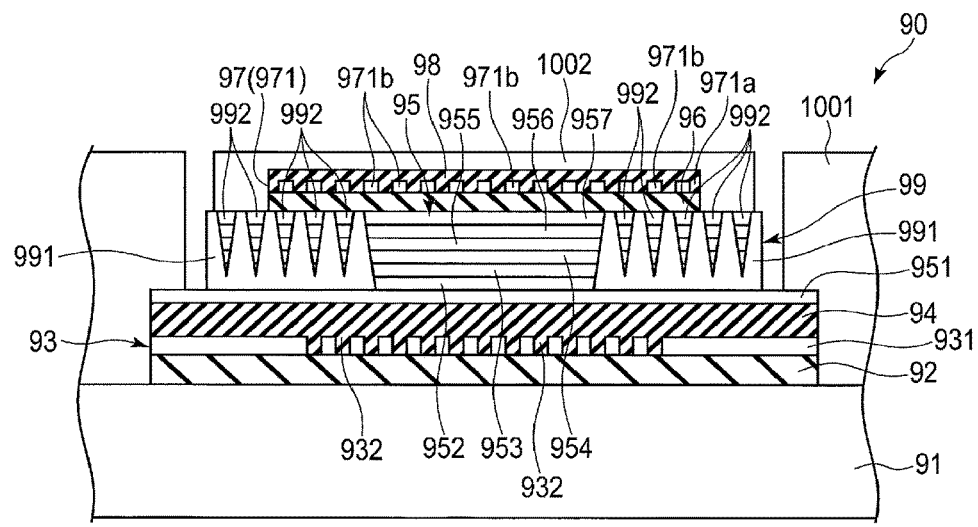
F I G. 10

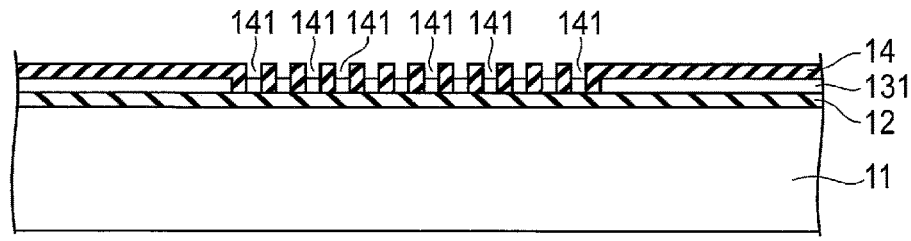
F I G. 9A
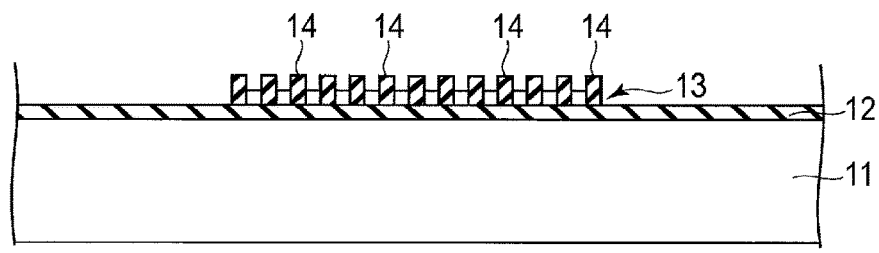
F I G. 9B
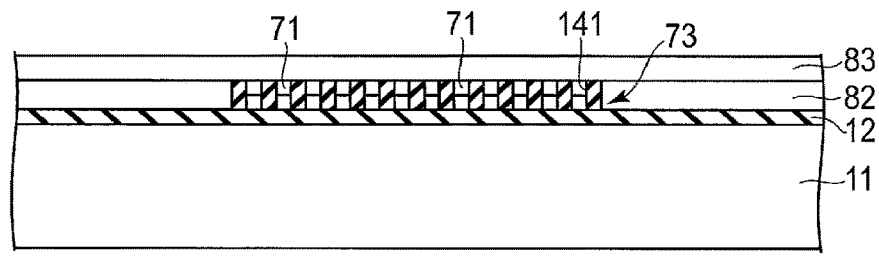
F I G. 9C
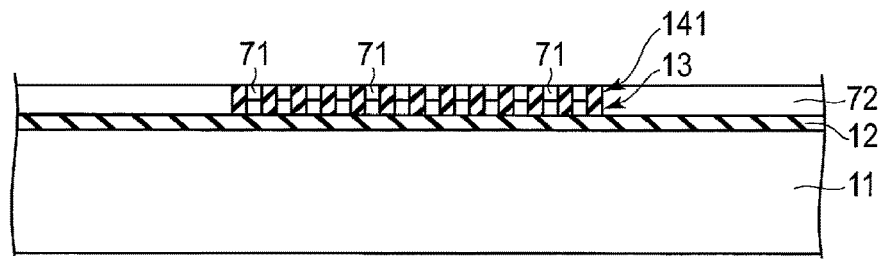
F I G. 9D

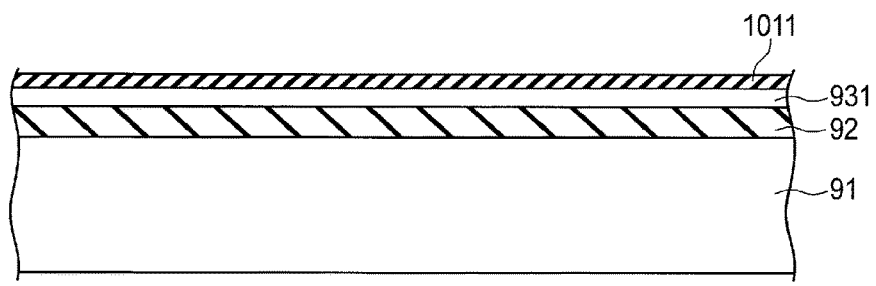
F I G. 11A
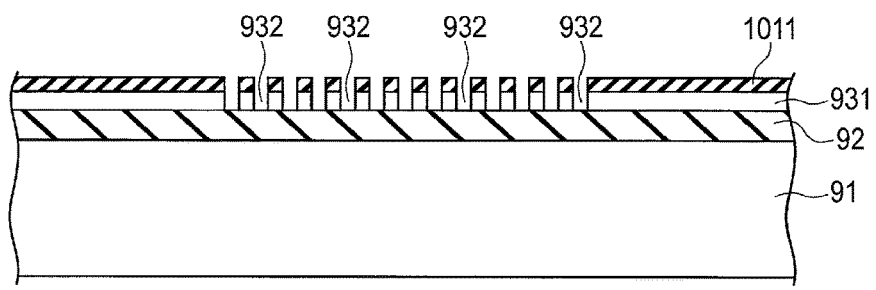
F I G. 11B
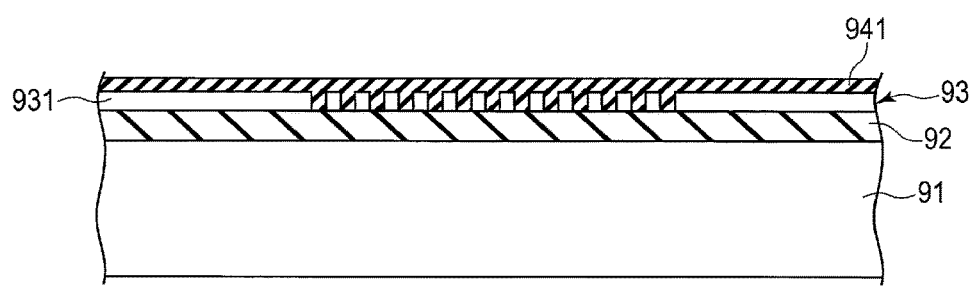
F I G. 11C

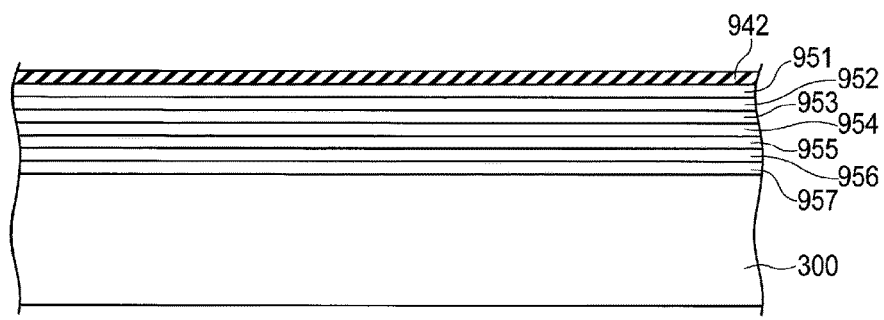
F I G. 11D
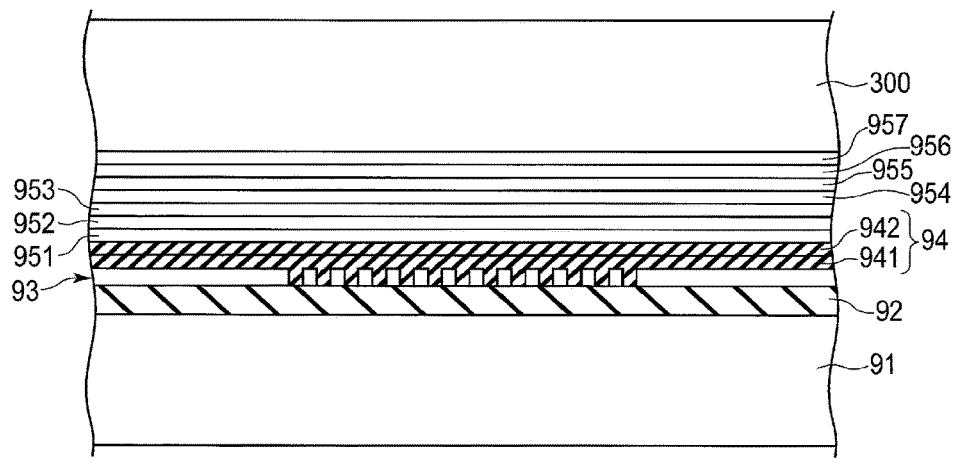
F I G. 11E
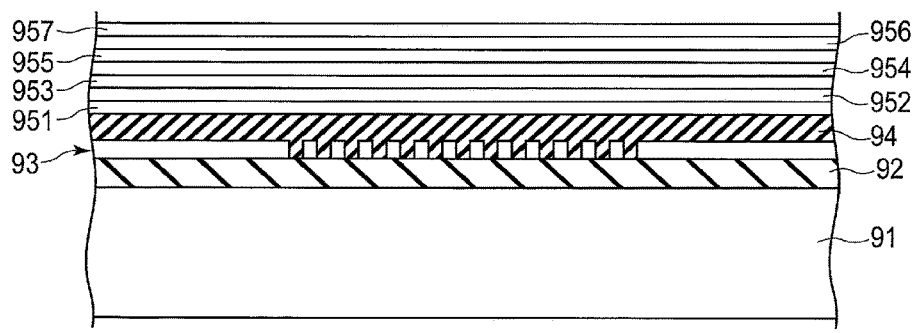
F I G. 11F

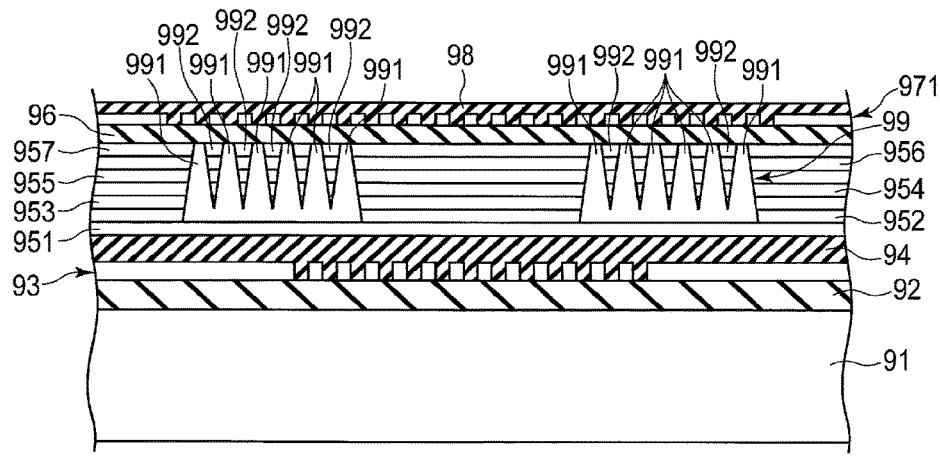
F I G. 11J
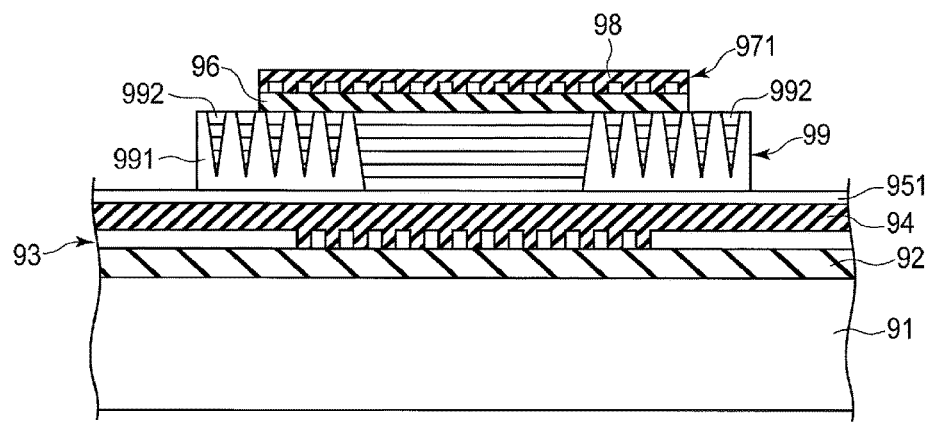
F I G. 11K

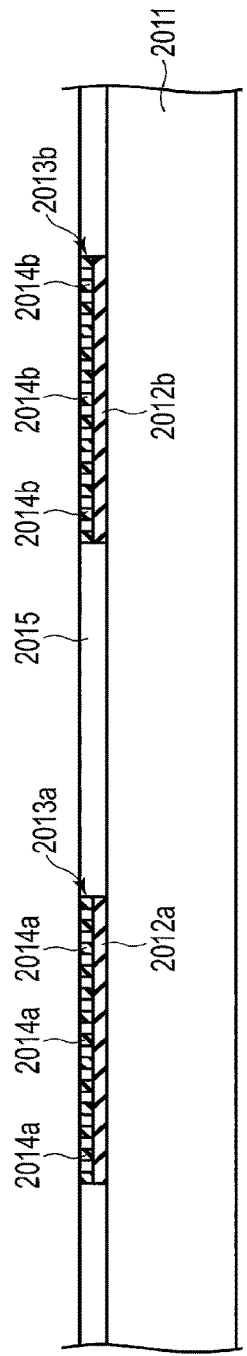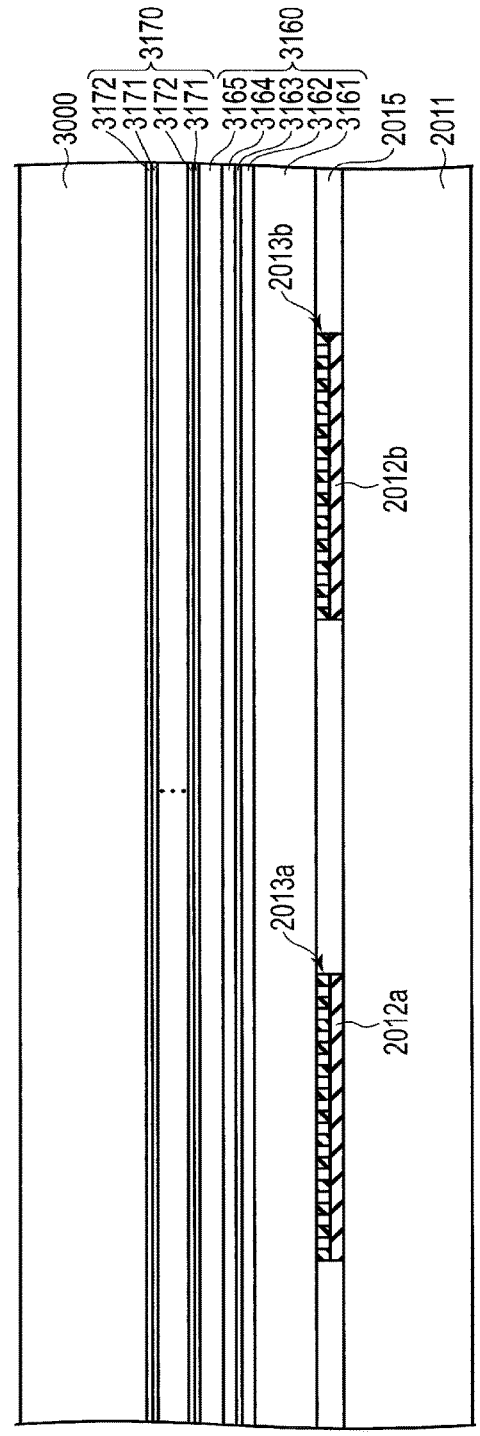
FIG. 12A
FIG. 12B

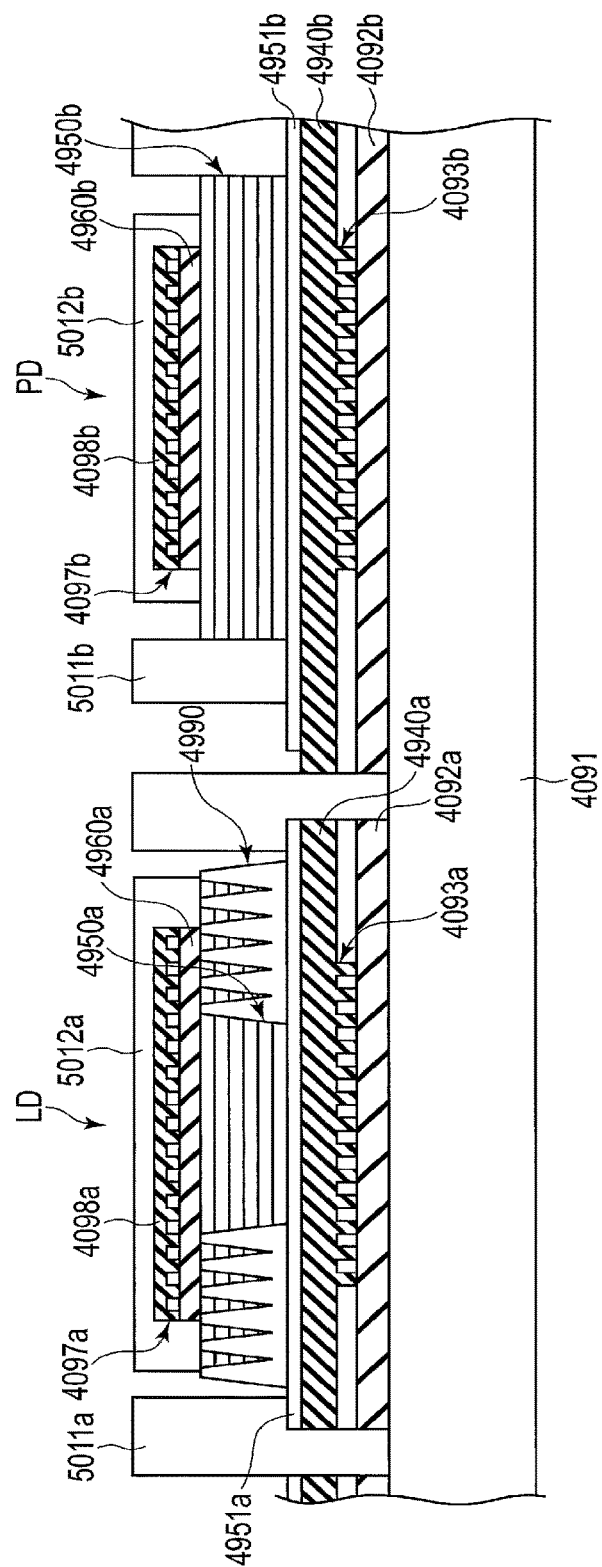
F I G. 13E ions No. 2015-058197, filed Mar. 20, 2015; and No. 2016-048033, filed Mar. 11, 2016, the entire contents of all of which are incorporated herein by reference.

OPTICAL SEMICONDUCTOR DEVICE AND METHOD FOR MANUFACTURING THE SAME

CROSS-REFERENCE TO RELATED APPLICATIONS

This application is based upon and claims the benefit of priority from Japanese Patent Applications No. 2015-058197, filed Mar. 20, 2015; and No. 2016-048033, filed Mar. 11, 2016, the entire contents of all of which are incorporated herein by reference.

FIELD

Embodiments described herein relate generally to an optical semiconductor device.

BACKGROUND

Optical semiconductor devices are broadly classified into semiconductor light-emitting devices and semiconductor light-receiving devices.

In recent years, as a semiconductor light-emitting device, attention has been paid to a vertical-cavity surface-emitting laser (VCSEL) device in which an optical semiconductor structure including an active layer (light-emitting layer) is sandwiched between upper and lower membrane reflectors each composed of a photonic crystal.

With respect to such a semiconductor laser device, it is required that heat is dissipated efficiently therefrom, and less distortion generates within the device structure.

BRIEF DESCRIPTION OF THE DRAWINGS

FIG. 1 illustrates a schematic cross-sectional view of a semiconductor light-emitting device according to a first embodiment.

FIG. 2 illustrates a schematic cross-sectional view of a semiconductor light-emitting device according to a second embodiment.

FIGS. 3A, 3B, 3C, 3D, 3E, 3F, 3G, 3H and 3I illustrate schematic cross-sectional views for explaining an example of a method for manufacturing the semiconductor light-emitting device according to the second embodiment.

FIGS. 6A and 6B illustrate schematic cross-sectional views for explaining a method for manufacturing the semiconductor light-emitting device according to the fourth embodiment.

FIG. 7 illustrates a schematic cross-sectional view of a semiconductor light-emitting device according to a fifth embodiment.

FIG. 8 illustrates a schematic cross-sectional view of a semiconductor light-emitting device according to a sixth embodiment.

FIGS. 9A, 9B, 9C and 9D illustrate schematic cross-sectional views for explaining a method for manufacturing the semiconductor light-emitting device according to the sixth embodiment.

FIG. 10 illustrates a schematic cross-sectional view of a semiconductor light-emitting device according to a seventh embodiment.

FIGS. 11A, 11B, 11C, 11D, 11E, 11F, 11G, 11H, 11I, 11J and 11K illustrate schematic cross-sectional views for explaining an example of a method for manufacturing the semiconductor light-emitting device according to the seventh embodiment.

FIGS. 12A, 12B, 12C, 12D and 12E illustrate schematic cross-sectional views for explaining a method for manufacturing an optical semiconductor device according to an eighth embodiment.

FIGS. 13A, 13B, 13C, 13D and 13E illustrate schematic cross-sectional views for explaining a method for manufacturing an optical semiconductor device according to a ninth embodiment.

DETAILED DESCRIPTION

Figure 3D:
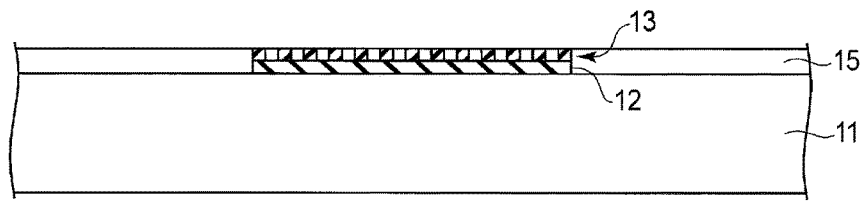

One or more embodiments will be explained below, suitably referring to the accompanying drawing Figures. The Figures are not to scale. Throughout the Figures, same reference numbers are used to denote identical or similar elements.

A semiconductor light-emitting device according to one embodiment comprises a substrate, a first light reflection structure provided in contact with the substrate, a buried layer surrounding the first light reflection structure, an optical semiconductor structure including an active layer, provided above the first light reflection structure, a second light reflection structure provided above the optical semiconductor structure, and a pair of electrodes which supply current to the optical semiconductor structure. The surface of the first light reflection structure and the surface of the buried layer are included in the same plane.

In one or more embodiments, one or both of the first and second light reflection structures include a structural layer whose refractive index changes periodically in its in-plane direction.

In one or more embodiments, one or both of the first and second light reflection structures are constituted by a laminate in which two materials having different refractive indices are stacked one upon another.

In one or more embodiments, one of the first and second light reflection structures is constituted by a laminate in which two materials having different refractive indices are stacked one upon another, and the other one includes a structural layer whose refractive index changes periodically in its in-plane direction.

In one or more embodiments, the substrate is composed of a different semiconductor material from the semiconductor material comprising the optical semiconductor structure.

In one or more embodiments, the substrate is a silicon substrate.

In one or more embodiments, the optical reflectance of the first light reflection structure and that of the second light reflection structure are different from each other.

In one or more embodiments, the active layer is narrower than the first light reflection structure.

In one or more embodiments, the active layer is wider that the first light reflection structure.

In one or more embodiments, the active layer is surrounded by an ion-implanted semiconductor.

In one or more embodiments, the optical semiconductor structure comprises Group III-V compound semiconductor.

In one or more embodiments, the second light reflection structure comprises a metal layer which doubles as one of the electrodes.

In one or more embodiments, the first light reflection structure further comprises a transparent electrode, and a metal layer is provided on the substrate, surrounding the transparent electrode to electrically connect with the transparent electrode.

In one or more embodiments, the first light reflection structure further comprises a metal grid electrode.

In one or more embodiments, a heat-dissipating metal is buried in the substrate, surrounding a region corresponding to the first light reflection structure.

In one or more embodiments, the semiconductor light-emitting device further comprises a thermally conductive dielectric layer between the substrate and the first light reflection structure, and/or between the first light reflection structure and the optical semiconductor structure.

In one or more embodiments, at least one of the first and second light reflection structures has a lens effect.

In one or more embodiments, the optical semiconductor structure includes a current constriction structure, and the current constriction structure is constituted by a current constriction layer provided in the optical semiconductor structure and including high resistance regions having relatively high electrical resistance and low resistance regions having relatively low electrical resistance, wherein the high and low resistance regions are arranged in a period corresponding to the period in the structural layer, and one of the electrodes is in contact with a portion of a surface of the current constriction structure.

In another embodiment, there is provided an optical semiconductor device comprising one substrate, and a semiconductor light-emitting device and a light-receiving device, which are provided on the substrate. In the optical semiconductor device, the semiconductor light-emitting device comprises a first light reflection structure provided in contact with the substrate, a buried layer surrounding the first light reflection structure, an optical semiconductor structure (semiconductor light-emitting structure) including an active layer, provided above the first light reflection structure, a second light reflection structure provided above the optical semiconductor structure, and a pair of electrodes which supply current to the optical semiconductor structure. The surface of the first light reflection structure and the surface of the buried layer are included in the same plane. On the other hand, the semiconductor light-receiving device comprises an optical semiconductor structure (semiconductor light-receiving structure) including an active layer, provided on the substrate, a first structural layer which is provided between the substrate and the semiconductor layer, in which refractive index changes periodically and into which light is incident from a side of the substrate, a light reflection structure comprising a second structural layer whose refractive index changes periodically, provided above the semiconductor layer, and a pair of electrodes which apply a voltage to the semiconductor layer. The optical semiconductor structure in the semiconductor light-emitting device and the optical semiconductor structure in the semiconductor light-receiving device have the same layer construction and are formed of the same semiconductor material.

In a still another embodiment, there is provided a method for manufacturing a semiconductor light-emitting device, comprising forming, on a substrate, a first light reflection structure and a buried layer surrounding the first light reflection structure such that a surface of the first light reflection structure and a surface of the buried layer are included in a same plane; bonding an optical semiconductor structure including an active layer to the first light reflection structure; and forming a second light reflection structure on the optical semiconductor structure.

A semiconductor light-emitting device according to another embodiment comprises a substrate, an optical semiconductor structure including an active layer and provided above the substrate, a first light reflection structure provided between the substrate and the optical semiconductor structure, a second light reflection structure provided above the optical semiconductor structure, and a pair of electrodes which supply current to the optical semiconductor structure. The optical semiconductor structure is provided with a current constriction structure. The first light reflection structure comprises a first structural layer whose refractive index changes periodically, and the second light reflection structure has an optical reflectance higher than that of the first light reflection structure. The substrate is composed of a semiconductor material having a bandgap energy higher than that of a semiconductor material comprising the active layer.

In one or more embodiments, the second light reflection structure comprises a semiconductor multilayer reflective film.

In one or more embodiments, the semiconductor multilayer reflective film is composed of a laminate in which first and second semiconductor layers having different refractive indices are stacked one upon another.

In one or more embodiments, the semiconductor light-emitting device further includes a transparent electrode provided on the first structural layer, and a metal layer is provided on the substrate, surrounding the transparent electrode to electrically connect with the transparent electrode.

In one or more embodiments, a heat dissipating metal is embedded in the semiconductor substrate, surrounding a region corresponding to the first light reflection structure.

In one or more embodiments, the semiconductor light-emitting device further includes a first thermally conductive dielectric layer provided between the substrate and the first light reflection structure, and/or a second thermally conductive dielectric layer provided between the first light reflection structure and the optical semiconductor structure.

In one or more embodiments, the semiconductor light-emitting device further includes a metal grid electrode provided on the first structural layer.

In one or more embodiments, the second light reflection structure comprises a second structural layer whose refractive index changes periodically.

In one or more embodiments, the second structural layer comprises high refractive-index regions having relatively high refractive index and low refractive-index regions having relatively low refractive index, which are periodically arranged two-dimensionally.

In one or more embodiments, the second structural layer is composed of a photonic crystal.

In one or more embodiments, the current constriction structure comprises a current constriction layer provided in the optical semiconductor structure and including high resistance regions having relatively high electrical resistance and low resistance regions having relatively low electrical resistance, wherein the high and low resistance regions are arranged in a period corresponding to the period in the second structural layer, and one of the electrodes is in contact with a portion of a surface of the current constriction structure.

In one or more embodiments, the low resistance regions comprise a semiconductor comprising the optical semiconductor structure, and the high resistance regions comprise such semiconductor which has been implanted with ions.

In one or more embodiments, the second light reflection structure doubles as the one of the electrodes.

In one or more embodiments, the first structural layer includes high refractive-index regions having relatively high refractive index and low refractive-index regions having relatively low refractive index, which are periodically arranged two-dimensionally.

In one or more embodiments, the first structural layer is composed of a photonic crystal.

In one or more embodiments, the optical semiconductor structure comprises a Group III-V compound semiconductor.

In one or more embodiments, the substrate is composed of a semiconductor material which is dissimilar in kind to a semiconductor comprising the optical semiconductor structure, and thus is a dissimilar substrate.

In one or more embodiments, the above dissimilar substrate is a silicon substrate.

In one or more embodiments, the first structural layer is surrounded by a semiconductor which is provided on the substrate and similar in kind to a semiconductor comprising the substrate, i.e., a similar semiconductor, and has its surface included in a plane including a surface of the similar semiconductor or located lower than the plane (embedded in the similar semiconductor). Alternatively, in another embodiment, the first structural layer is provided in a recess in the substrate, and has its surface included in a plane including the surface of the substrate or located lower than the plane.

According to another embodiment, a method for manufacturing a semiconductor light-emitting device is provided, which comprises forming, on a substrate, a first light reflection structure comprising a first structural layer whose refractive index changes periodically, an optical semiconductor structure including an active layer and a second light reflection structure comprising a second structural layer; providing the optical semiconductor structure with a current constriction structure; and forming a pair of electrodes which supply current to the optical semiconductor structure.

According to still another embodiment, a method for manufacturing a semiconductor light-emitting device is provided, which comprises forming, on a substrate, a first light reflection structure comprising a first structural layer whose refractive index changes periodically, an optical semiconductor structure including an active layer and a second light reflection structure comprising a second structural layer whose refractive index changes periodically; and implanting ions in a current constriction structure formation region of the optical semiconductor structure with the second structural layer used as a mask to cause the ion-implanted portions to have an electrical resistance higher than that of non-ion-implanted portions, thereby forming a current constriction layer in which high resistance regions having relatively high resistance and low resistance regions having relatively low resistance are arranged in a period corresponding to the period in the second structural layer. This method for manufacturing the semiconductor light-emitting device further comprises forming a pair of electrodes for supplying current to the optical semiconductor structure. One of the pair of electrodes is in contact with a part of a surface of the current constriction layer.

In one or more embodiments, the substrate is a dissimilar substrate composed of a semiconductor material which is dissimilar in kind to a semiconductor comprising the optical semiconductor structure.

In one or more embodiments, the forming the first light reflection structure, the optical semiconductor structure and the second light reflection structure on the substrate comprises forming the first light reflection structure on the dissimilar substrate, providing a first semiconductor structure; forming the optical semiconductor structure on a similar substrate composed of a semiconductor material similar in kind to the semiconductor material comprising the optical semiconductor structure, providing a second semiconductor structure; bonding the first and second semiconductor structures such that the first light reflection structure and the optical semiconductor structure face each other, providing a third semiconductor structure; and removing the similar substrate from the third semiconductor structure.

In one or more embodiments, the providing the first semiconductor structure comprises forming a first dielectric layer for the bonding on the first light reflection structure, the providing the second semiconductor structure comprises forming a second dielectric layer for the bonding on the optical semiconductor structure; and the bonding comprises bringing the first dielectric layer for the bonding and the second dielectric layer for the bonding into contact with each other.

In one or more embodiments, the first dielectric layer for the bonding and the second dielectric layer for the bonding are formed of the same dielectric material, and are, for example, silicon oxide layers.

In another embodiment, an optical semiconductor device is provided which comprises a substrate, and a semiconductor light-emitting device and a semiconductor light-receiving device which are provided on the substrate.

The semiconductor light-emitting device in the optical semiconductor device comprises an optical semiconductor structure provided on the substrate and including an active layer, a first light reflection structure provided between the substrate and the optical semiconductor structure, a second light reflection structure provided above the optical semiconductor structure, and a pair of electrodes which supply current to the optical semiconductor structure. The optical semiconductor structure is provided with a current constriction structure, and the first light reflection structure comprises a first structural layer whose refractive index changes periodically. The second light reflection structure has an optical reflectance higher than that of the first light reflection structure, and the substrate is composed of a semiconductor material which has a bandgap energy higher than that of a semiconductor material comprising the active layer.

The semiconductor light-receiving device in the above optical semiconductor device comprises an optical semiconductor structure including an active layer, provided on the substrate a first structural layer which is provided between the substrate and the optical semiconductor structure, in which refractive index changes periodically and into which light is incident from a side of the substrate, a light reflection structure comprising a second structural layer whose refractive index changes periodically, provided above the optical semiconductor structure, and a pair of electrodes which apply a voltage to the optical semiconductor structure.

In the optical semiconductor device, the optical semiconductor structure in the semiconductor light-emitting device and the optical semiconductor structure in the semiconductor light-receiving device have the same layer construction and are formed of the same semiconductor material.

In one or more embodiments, the optical semiconductor structure including the active layer comprises first and second light confinement layers sandwiching the active layer, first and second clad layers provided on those sides of the first and second light confinement layers, which are away from the active layer, respectively, and first and second contact layers provided on those sides of the first and second clad layers, which are away from the first and second light confinement layers, respectively. In this case, the first light confinement layer, the first clad layer and the first contact layer may be provided on one of both sides of the active layer, i.e., they may be provided between the active layer and the substrate, while the second light confinement layer, the second clad layer and the second contact layer may be provided on the other side of the active layer.

In another embodiment, the first clad layer can double as a first contact layer. Furthermore, for example, in an embodiment in which the second light reflection structure comprises the semiconductor multilayer reflective film, the optical semiconductor structure may include no second contact layer, and the semiconductor multilayer reflective film can serve as a contact layer.

FIG. 1 schematically illustrates a semiconductor light-emitting device 1 according to a first embodiment. The device 1 is a vertical cavity surface emitting laser (VCSEL) device.

As illustrated in FIG. 1, the semiconductor light-emitting device 1 comprises a substrate 11. The substrate 11 may be a similar substrate which is composed of a semiconductor material similar in kind to a semiconductor material constituting an optical semiconductor structure including an active layer (i.e., a light-emitting layer) provided above the substrate 11, or may be a dissimilar substrate which is composed of a semiconductor material dissimilar in kind to the semiconductor material constituting the optical semiconductor structure noted above (for example, a silicon substrate in the case where the semiconductor material of the optical semiconductor structure including the active layer is a Group III-V or II-IV compound semiconductor).

On the substrate 11, a first light reflection structure 13 is provided, through a dielectric layer (for example, a silicon oxide layer) 12. The first light reflection structure 13 may comprise or consist of a structural layer whose refractive index changes periodically in its in-plane direction. The structural layer 13 is constituted by high refractive-index regions having relatively high refractive index and low refractive-index regions having relatively low refractive index, which are periodically arranged two-dimensionally. More specifically, the structural layer 13 can be composed of a thin film of a photonic crystal. That is, the structural layer 13 comprises a high refractive-index layer of a high refractive index material as a matrix, in which dielectric materials having a lower refractive index than that of the matrix are embedded at regular intervals. As the matrix, for example, amorphous silicon may be exemplified, and as the dielectric materials, for example, silicon oxide, silicon nitride, silicon oxynitride, aluminum nitride or aluminum oxide may be exemplified. Referring to FIG. 2, in amorphous silicon constituting the matrix 131, a number of holes 132 are provided at regular intervals, and dielectrics 14 are filled in the holes 132 in the amorphous silicon layer 131. The structural layer has a flat surface.

Furthermore, a semiconductor layer 15 (which will be referred to as buried layer hereinafter) which is similar in kind to the substrate 11 (such similar layer will be hereinafter referred to a similar semiconductor layer) is provided, surrounding the structural layer 13 which constitutes the first light reflection structure. For example, in the case where the substrate 11 is a silicon substrate, the buried layer 15 can be composed of silicon.

The surface of the structural layer 13 and the surface of the buried layer 15 are included in the same plane. In other words, the surface of the structural layer 13 is formed so as to constitute the same plane as the surface of the buried layer 15. As apparent from the above, the surface of the structural layer, i.e., the surface of the first light reflection structure, is flat, and the surface of the buried layer 15 is also flat and flush with (or constitutes the same plane with) the surface of the first light reflection structure. Thus, an optical semiconductor 16 (which will be described in more detail below) provided on the structural layer 13 (whose rear surface is flat) can closely contact with the flush-with surface entirely, with the result that the heat generated at the optical semiconductor structure 16 can be efficiently dissipated through the substrate, the stress applied on the optical semiconductor structure can be relaxed, no detachment of the structural layer 13 from the optical semiconductor structure may occur at their interface, the device properties can be stably maintained even when the device is subjected to change in the environmental temperatures and to temperature cycles, ensuring high reliability.

On the surface of the similar semiconductor layer 15 including the surface of the structural layer 13, the optical semiconductor structure 16 is provided, which includes a first clad layer 161 of a first conductivity type doubling as a contact layer, a first light confinement layer 162 of the first conductivity type, an active layer 163, a second light confinement layer 164 of a second conductivity type and a second clad layer 165 of the second conductivity type. It should be noted that the first conductivity type and the second conductivity type refer to two conductivity types opposite to each other; if one is p-type, the other is n-type, and conversely, if one is n-type, the other is p-type.

On the optical semiconductor structure 16, a second light reflection structure is provided. In this embodiment, the second light reflection structure comprises a semiconductor multilayer reflective film (distributed Bragg reflector (DBR)) 17.

The semiconductor multilayer reflective film 17 has a structure in which a semiconductor layer 171 and a semiconductor layer 172, having different refractive indices from each other, are stacked one upon another. Such DBR 17 can be provided by stacking AlGaInAs and InP one upon another. Also, it can be provided by stacking AlGaAsSb and AlAsSb one upon another. It is convenient that the first clad layer 161 and the second clad layer 165 are both composed of n-type or p-type InP.

The semiconductor light-emitting device 1 further comprises a pair of electrodes for supplying current to the optical semiconductor structure 16. Of the pair of electrodes, one electrode 2 is provided in an annular groove 3, which penetrates the first light reflection structure 17, the second clad layer 165, the second light confinement layer 164, the active layer 163 and the first light confinement layer 162, and reaches midway through the first clad layer 161, and is connected with the first clad layer 161. Insulating layers 4 and 5 are provided on the side walls of the annular groove 3. The other electrode 6 is provided, covering the uppermost layer 172 of the DBR 17. That is, the uppermost layer 172 of the DBR 17 functions as a contact layer with respect to the electrode 6. The electrode 6 can be composed of a metal layer. Needless to say, this metal layer doubles as the other one of the pair of electrodes. In addition, the metal layer further increases the reflectance of the second light reflection structure 17. The reflectance of the second light reflection structure 17 can be increased to nearly 99.9% by the provision of the metal layer 6 thereon. The material of the metal layer 6 can be selected in accordance with light emitted from the laser. For example, in the case where the laser emits visible light, the metal layer 6 may be formed of silver, and in the case where the laser emits near-infrared light, the metal layer 6 may be formed of aluminum or copper.

Thus, by the provision of the metal layer 6 as the uppermost layer of the second light reflection structure, light generated in the active layer 163 can be more reliably extracted through the substrate 11.

In one embodiment, the light generated in the active layer 163 is amplified while it is reciprocating between the above two light reflection structures, and is emitted through the first light reflection structure 13 in a direction perpendicular to the surface of the substrate 11. In this case, in order to cause the light generated at the active layer 163 to be transmitted through the substrate 11, the substrate 11 should be formed of a semiconductor material having a bandgap energy higher than that of a semiconductor material constituting the active layer. For example, in the case where the active layer is formed of a Group III-V semiconductor or a Group II-IV compound semiconductor, the substrate 11 can be formed of silicon.

In the semiconductor light-emitting device 1 illustrated in FIG. 1, the active layer 163 is wider than the first light reflection structure 13. That is, the surface area of the active layer 163 is larger than the surface area of the first light reflection structure 13. In the present disclosure, the DBR may have a lens effect. Specifically, the DBR may have a structure of Fresnel lens.

FIG. 2 schematically illustrates a semiconductor light-emitting device 10 according to a second embodiment. The device 10 is a vertical cavity surface emitting laser (VCSEL) device, in which a second light reflection structure comprises a semiconductor multilayer reflective film (DBR).

As illustrated in FIG. 2, the semiconductor light-emitting device 10 comprises a substrate 11. The substrate 11 may be a similar substrate which is composed of a semiconductor material similar in kind to a semiconductor material constituting an optical semiconductor structure (semiconductor light-emitting structure) including an active layer (i.e., a light-emitting layer) provided above the substrate 11, or may be a dissimilar substrate which is composed of a semiconductor material dissimilar in kind to the semiconductor material constituting the optical semiconductor structure noted above (for example, a silicon substrate in the case where the semiconductor material of the optical semiconductor structure including the active layer is a Group III-V or II-IV compound semiconductor).

On the substrate 11, a first light reflection structure 13 is provided, through a dielectric layer (for example, a silicon oxide layer) 12. The first light reflection structure 13 comprises a first structural layer whose refractive index changes periodically in its in-plane direction. The first structural layer 13 is constituted by high refractive-index regions having relatively high refractive index and low refractive-index regions having relatively low refractive index, which are periodically arranged two-dimensionally. More specifically, the first structural layer 13 can be composed of a thin film of a photonic crystal. That is, the first structural layer 13 comprises a high refractive-index layer of a high refractive index material as a matrix, in which dielectric materials having a lower refractive index than that of the matrix are embedded at regular intervals. As the matrix, for example, amorphous silicon may be exemplified, and as the dielectric materials, for example, silicon oxide, silicon nitride, silicon oxynitride, aluminum nitride or aluminum oxide may be exemplified. Referring to FIG. 2, in amorphous silicon constituting the matrix 131, a number of holes 132 are provided at regular intervals, and dielectrics 14 are filled in the holes 132 in the amorphous silicon layer 131.

Furthermore, a semiconductor layer 15 (buried layer) which is similar in kind to the substrate 11 (which similar layer will be hereinafter referred to a similar semiconductor layer) is provided, surrounding the first structural layer 13 constituting the first light reflection structure. For example, in the case where the substrate 11 is a silicon substrate, the semiconductor layer 15 can be composed of silicon. The first structural layer 13 may be provided such that its surface is included in the plane including the surface of the similar semiconductor layer, or may be embedded in the similar semiconductor layer 15. Alternatively, it is possible that a recess corresponding to the first structural layer 13 is formed in the substrate 11, and the first structural layer 13 is formed in the recess. In this case also, the surface of the first structural layer 13 is including in the plane including the surface of the substrate 11, or located lower than that plane.

The surface of the first structural layer 13 and the surface of the buried layer 15 are included in the same plane. In other words, the surface of the first structural layer 13 is flush with the surface of the buried layer 15. Thus, an optical semiconductor 16 (which will be described in more detail below) provided on the structural layer 13 (whose rear surface is flat) can closely contact with the flush-with surface entirely, with the result that the heat generated at the optical semiconductor structure 16 can be efficiently dissipated through the substrate, the stress applied on the optical semiconductor structure can be relaxed, no detachment of the structural layer 13 from the optical semiconductor structure may occur at their interface, the device properties can be stably maintained even when the device is subjected to change in the environmental temperatures and to temperature cycles, ensuring high reliability.

On the surface of the similar semiconductor layer 15, including the surface of the first structural layer 13, an optical semiconductor structure 16 is provided, including a first clad layer 161 of a first conductivity type which doubles as a first contact layer of the first conductivity type, a first light confinement layer 162 of the first conductivity type, an active layer 163, a second light confinement layer 164 of a second conductivity type and a second clad layer 165 of the second conductivity type.

On the optical semiconductor structure 16, a second light reflection structure is provided. In this embodiment, the second light reflection structure comprises a semiconductor multilayer reflective film (DBR) 17.

The semiconductor multilayer reflective film 17 has a structure in which a semiconductor layer 171 and a semiconductor layer 172, having different refractive indices from each other, are stacked one upon another. The DBR 17 having such a structure can be provided by stacking AlGaInAs and InP one upon another. Also, it can be provided by stacking AlGaAsSb and AlAsSb one upon another. Furthermore, it is convenient that the first clad layer 161 and the second clad layer 165 are both composed of n-type or p-type InP.

The optical semiconductor structure 16 is provided with a current constriction structure. The current constriction structure constricts current passing through the semiconductor laser in order to reduce a reactive current which diffuses within the semiconductor laser, and defines a light emission region including the active layer 163, or an aperture.

In the present embodiment, a current constriction layer 18 is provided in the optical semiconductor structure 16. The current constriction layer 18 can be formed by, for example, proton implantation. Thus, the active layer 163 is surrounded by an ion-implanted semiconductor layer.

In the above structure, the current constriction layer 18, including a part of the first clad layer 161, can be mesa-processed to have a truncated cone or a truncated pyramid, as illustrated in FIG. 2.

The device 10 further comprises a pair of electrodes 201 and 202 for supplying current to the optical semiconductor structure 16. Further, an insulating layer 19 covers the periphery of the current constriction layer 18 and the surface of the first clad layer 161, except for a part of the surface of the current constriction layer 18 and the surface of the uppermost layer 172 of the DBR 17. Of the pair of electrodes, one electrode 201 is connected to the first clad layer 161 through the insulating layer 19. The electrode 201 may be annular in shape.

The other electrode 202 covers the peripheral portion of the current constriction layer 18, the surface of a part of the current constriction layer 18 which is exposed from the insulating layer 19, and the uppermost layer 172 of the DBR 17. That is, the uppermost layer 172 of the DBR 17 functions as a contact layer to the electrode 202. The electrode 202 can be composed of a metal layer. Needless to say, the metal layer 202 doubles as the other one of the pair of electrodes. In addition, the metal layer 202 further increases the reflectance of the second light reflection structure 17 comprising the DBR. The reflectance of the second light reflection structure 17, i.e., the DBR, can be increased to nearly 99.9% by the provision of the metal layer 202 on the DBR. The material of the metal layer 202 can be selected in accordance with light emitted from the laser. For example, in the case where the laser emits visible light, the metal layer 202 may be formed of silver, and in the case where the laser emits near-infrared light, the metal layer may be formed of aluminum or copper.

Thus, by the provision of the metal layer 202 as the uppermost layer of the second light reflection structure, light generated in the active layer 163 can be more reliably extracted through the substrate 11.

The light generated in the active layer 163 is amplified while it is reciprocating between the above two light reflection structures, and is emitted through the first light reflection structure 13 in a direction perpendicular to the surface of the substrate 11. In this case, in order to cause the light generated at the active layer 163 to be transmitted through the substrate 11, the substrate 11 should be formed of a semiconductor material having a bandgap energy higher than that of a semiconductor material constituting the active layer. For example, in the case where the active layer is formed of a Group III-V semiconductor or a Group II-IV compound semiconductor, the substrate 11 can be formed of silicon.

In the semiconductor light-emitting device illustrated in FIG. 2, the active layer 163 is narrower than the first light reflection structure. In other words, the surface area of the active layer 163 is smaller than the surface area of the first light reflection structure 13. Further, the DBR 17 may have a lens effect. Specifically, the DBR 17 may have a structure of Fresnel lens.

Next, an example of a method for manufacturing the semiconductor light-emitting device (according to the second embodiment) as illustrated in FIG. 2 will be explained with reference to FIGS. 3A to 3I.

This method is one example of a method for manufacturing the semiconductor laser device illustrated in FIG. 2 wherein the substrate 11 is a dissimilar substrate that is composed of a semiconductor material dissimilar in kind to the semiconductor material constituting the substrate 16.

First, as illustrated in FIG. 3A, on a dissimilar substrate 11 such as a silicon substrate, a dielectric layer (for example, a silicon oxide layer) 12, an amorphous silicon layer 131 and a dielectric layer (for example, a silicon oxide layer) 21 are formed.

Then, the dielectric layer 21 is patterned. Using the patterned dielectric layer 21 as a mask, the amorphous silicon layer 131 is subjected to a wet or dry etching, thereby forming openings 132 at regular intervals, or at a constant period, in the amorphous silicon layer 131 (FIG. 3B).

Thereafter, without removing the dielectric layer mask 21, another dielectric layer is formed on the entire surface of the dielectric layer mask 21, including the insides of the openings 132 in the amorphous silicon layer 131. Then, the above another dielectric layer and the dielectric layer mask 21 lying thereunder are removed by chemical mechanical polishing (CMP), thereby exposing the surface of the amorphous silicon layer (matrix) 131 (and also the surfaces of the dielectrics 14 remaining in the amorphous silicon layer 131, i.e., in the openings 132) (FIG. 3C). The dielectrics 14 are remnants of the above another dielectric layer after the CMP.

Subsequently, the amorphous silicon layer 131 and the dielectric layer 12 lying thereunder are successively removed by etching, except for a region corresponding to the first structural layer 13, thereby partially exposing the surface of the substrate 11. Thereafter, a semiconductor that is similar in kind to the substrate 11, i.e., a similar semiconductor, for example, an amorphous silicon 15, is deposited on the first structural layer 13 and the exposed surface portion of the substrate 11, and then the amorphous silicon 15 is planarized by CMP until the surface of the first structural layer 13 is exposed (FIG. 3D). Thus, the surface of the first structural layer 13 and the surface of the amorphous silicon layer (buried layer) 15 are flat, and are flush with each other. The semiconductor structure provided with the first structural layer 13 will be referred to as a first semiconductor structure.

Figure 3E:
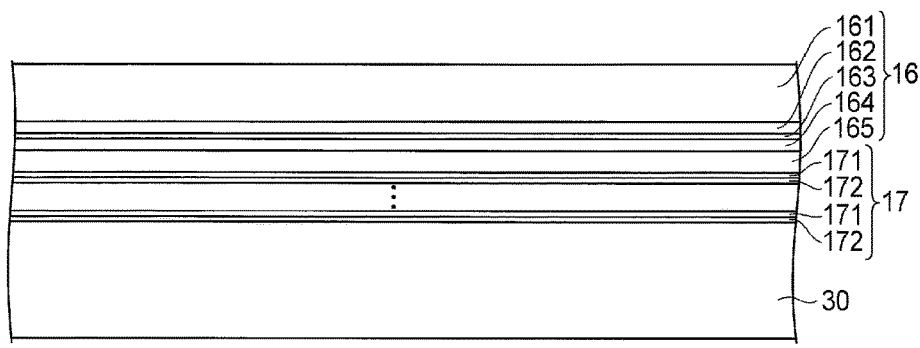

On the other hand, as illustrated in FIG. 3E, on a similar substrate (for example, a Group III-V compound semiconductor substrate) 30, a semiconductor layer 171 and a semiconductor layer 172 having different refractive indices are stacked one upon the other to form a semiconductor multilayer reflective film (DBR) 17. As described above, the DBR 17 can be formed by stacking AlGaInAs and InP one upon the other. In this case, it is convenient that a first clad layer 161 and a second clad layer 165, which will be described later, are both formed of n-type or p-type InP. On the DBR 17, the second clad layer 165, a second light confinement layer 164, an active layer 163, a first light confinement layer 162 and the first clad layer 161 (doubling as a contact layer) 161 are stacked to form an optical semiconductor structure 16. The optical semiconductor structure 16 is formed of, for example, Group III-V compound semiconductors. In this way, the semiconductor structure provided with the optical semiconductor structure 16 including the active layer is obtained, which will be hereinafter referred to as a second semiconductor structure.

Figure 3F:
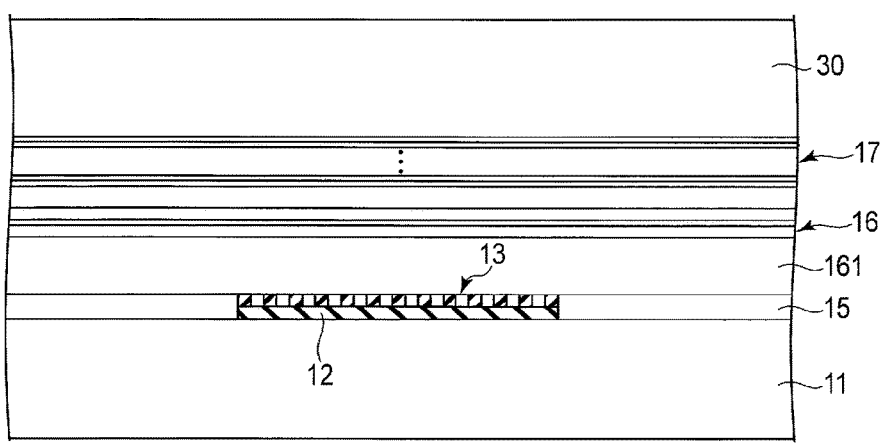

Next, the first semiconductor structure and the second semiconductor structure are bonded to each other such that the surface of the first semiconductor structure which includes the surface of the first structural layer 13 faces the first clad layer 161 in the second semiconductor structure. In the case where the first clad layer 161 is formed of InP, it can be directly bonded to the amorphous silicon layer 15. The structure thus obtained will be hereinafter referred to as a third semiconductor structure (FIG. 3F).

Figure 3G:
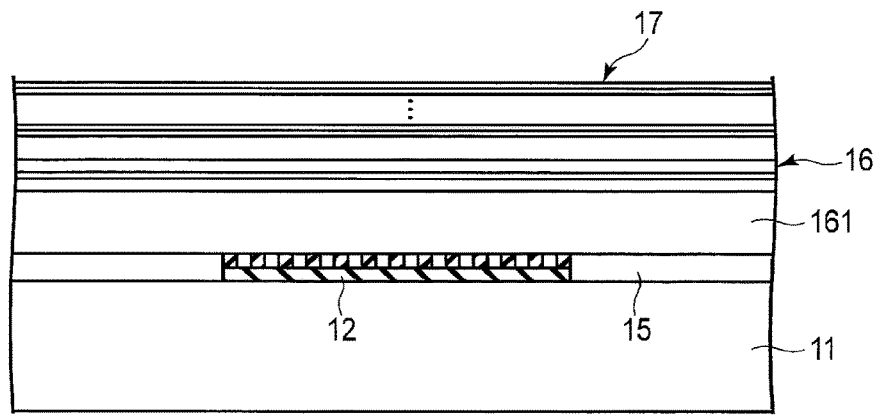

Next, from the third semiconductor structure, the similar substrate 30 is removed by mechanical polishing or wet etching. Thus, the surface of the DBR 17 is exposed (FIG. 3G).

Figure 3H:
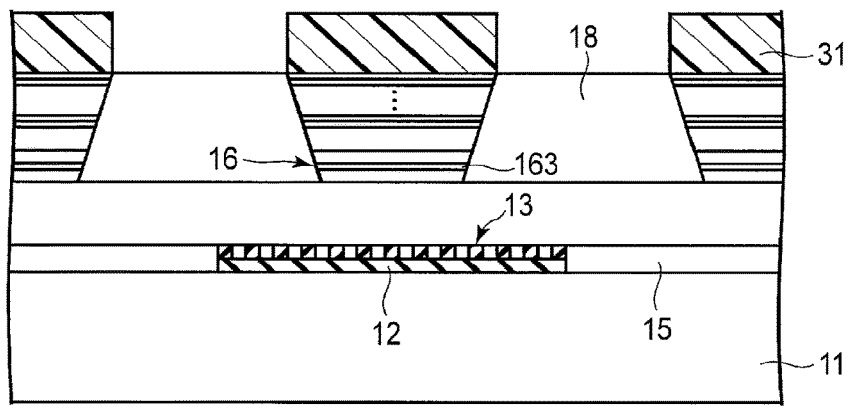

Next, a mask 31 is formed on the surface the DBR 17, except for the surface of the current constriction layer formation region in the semiconductor layer structure, and ion implantation is performed on the current constriction layer formation region. The ion implantation is, for example, proton implantation. By such ion implantation, a current constriction layer 18 is formed in the optical semiconductor structure 16 and also in the DBR 17 (FIG. 3H). The current constriction layer 18 may be annular in shape.

Figure 3I:
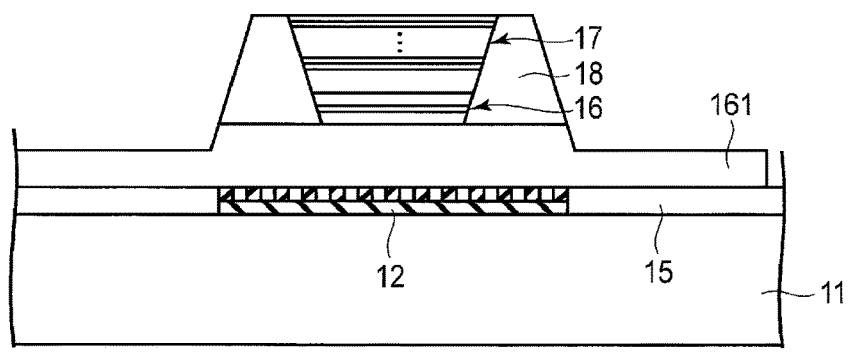

Then, after removing the mask 31, the current constriction layer 18 is subjected to mesa processing such that it is formed in a truncated cone (FIG. 3I).

Thereafter, an insulating layer 19 and electrodes 201 and 202 are formed, whereby a semiconductor light-emitting device having the structure illustrated in FIG. 2 is fabricated. Needless to say, the optical semiconductor structure 16 and the second light reflection structure 17 both defined by the current constriction layer 18 and the first light reflection structure 13 form an optical resonator.

According to the method explained with reference to FIGS. 3A to 3I, the finished semiconductor light-emitting device includes the optical semiconductor structure 16, which is formed of a Group III-V compound semiconductor, above the dissimilar substrate (for example, silicon substrate) 11; however, lattice match is achieved since the optical semiconductor structure 16 was formed above the similar substrate 30. Therefore, it is not necessary to pay attention to lattice mismatch which would occur, for example, in the case where a Group III-V compound semiconductor layer is grown on a dissimilar substrate. In other words, according to the above method, it is not necessary to apply a heteroepitaxial growth.

Here, a method for manufacturing the semiconductor light-emitting device 1 illustrated in FIG. 1 is briefly described. First, according to the procedures described with reference to FIGS. 3A to 3G, the structure illustrated in FIG. 3G is fabricated. Then, the groove 3 depicted in FIG. 1 is formed, and the insulating layers 4 and 5 are formed. Finally, the electrodes 2 and 6 depicted in FIG. 1 are formed, thus finishing the semiconductor light-emitting device 1 illustrated in FIG. 1.

Figure 4:
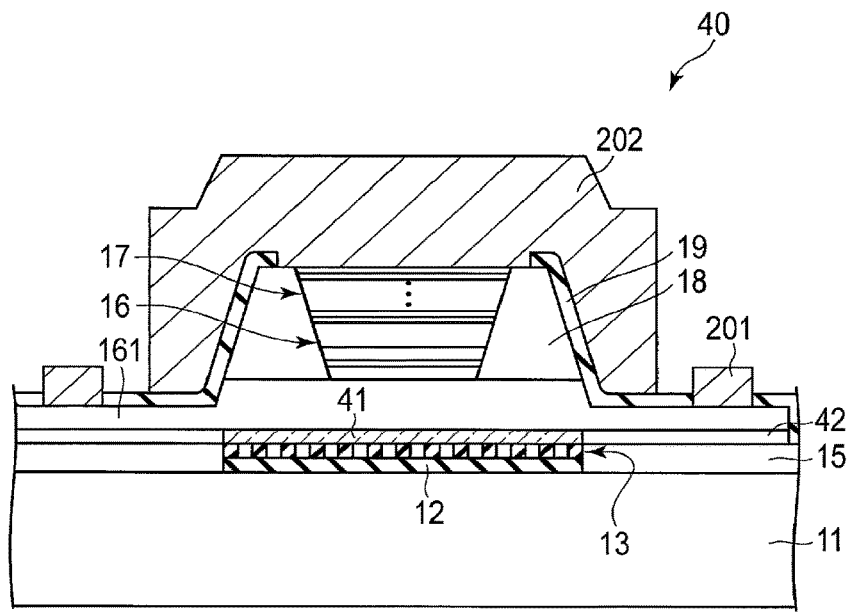
FIG. 4 illustrates a schematic cross-sectional view of a semiconductor light-emitting device according to a third embodiment.

FIG. 4 illustrates a schematic cross-sectional view of a semiconductor light-emitting device 40 according to a third embodiment.

The device 40 illustrated in FIG. 4 has the same structure as the device 10 illustrated in FIG. 2, except that it has a transparent electrode layer 41 on the first structural layer 13, and a metal layer 42 surrounds the transparent electrode 41 on the amorphous silicon layer 15. The transparent electrode layer 41 can be formed of indium titanium oxide (ITiO), indium tin oxide (ITO) or the like. Furthermore, the metal layer 42 can be formed of tungsten or the like. Since the transparent electrode 41 is provided, and the metal layer 42 surrounds the transparent electrode layer 41, they can serve as a path for current which flows between the pair of electrodes 201 and 202.

Figure 5:
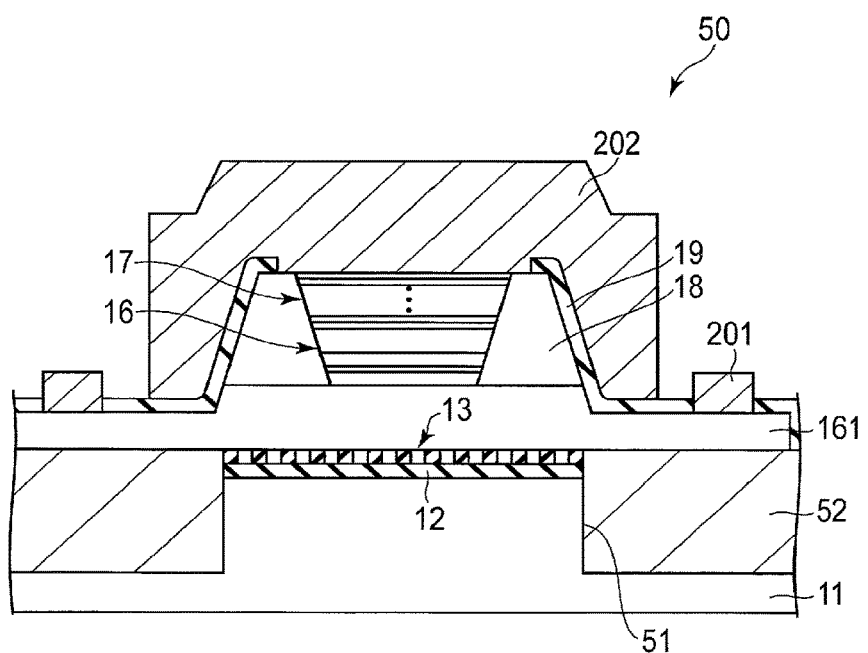
FIG. 5 illustrates a schematic cross-sectional view of a semiconductor light-emitting device according to a fourth embodiment.

FIG. 5 illustrates a schematic cross-sectional view of a semiconductor light-emitting device 50 according to a fourth embodiment.

The device 50 illustrated in FIG. 5 has the same structure as the semiconductor light-emitting device 10 illustrated in FIG. 2 except that a groove 51 surrounds a region in the substrate 11, which corresponds to the region of the first structural layer 13, and a heat dissipating metal 52 is filled in the groove 51. As the metal 52, for example, copper can be used. The metal 52 embedded in the substrate 11 improves the heat dissipation characteristic of the semiconductor light-emitting device 50. Furthermore, the embedded metal 52 can also serve as a path for current flowing between the pair of electrodes 201 and 202. The surface of the buried metal 52 is flush with the surface of the first structural layer 13.

A method for manufacturing the device 50, which has the embedded metal 52, will be explained with reference to FIGS. 5A and 6B. First, as explained with reference to FIG. 3D, the first structural layer 13 is formed on the substrate 11, and then the groove 51 for embedding the metal is provided in the substrate 11 by etching (FIG. 6A).

Then, the heat dissipating metal 52 is deposited in the groove 51, and its surface is planarized by CMP so as to be flush with the surface of the first light reflection structure, thereby providing a semiconductor structure corresponding to the above-noted first semiconductor structure (FIG. 6B). Subsequent steps are carried out in the manner explained with reference to FIGS. 3E and 3F and 3G to 3I. Thus, the semiconductor light-emitting device 50 can be fabricated.

FIG. 7 illustrates a schematic cross-sectional view of a semiconductor light-emitting device 60 according to a fifth embodiment.

The device 60 illustrated in FIG. 7 has the same structure as the device 10 illustrated in FIG. 2 except that it further comprises a first thermally conductive dielectric layer 61 provided between a substrate 11 and a first light reflection structure (first structural layer) 13 (and a dielectric layer 12 provided thereunder) and a second thermally conductive dielectric layer 62 formed between the first light refection layer 13 and an optical semiconductor structure 16. The thermally conductive dielectric layers 61 and 62 may be each composed of aluminum nitride.

In the device 60 illustrated in FIG. 7, a dielectric layer (for example, a silicon oxide layer) 63 is interposed between the first structural layer 13 (and an amorphous silicon layer 15) and the second thermally conductive dielectric layer 62. The dielectric layer 63 is provided to bond a semiconductor structure corresponding to the above-noted first semiconductor structure and a semiconductor structure corresponding to the above-noted second semiconductor structure to each other. That is, the uppermost layer of the semiconductor structure corresponding to the first semiconductor structure is a dielectric layer on the first structural layer 13 (and the amorphous silicon layer 15), and the uppermost layer of the semiconductor structure corresponding to the second semiconductor structure is a dielectric layer on the second thermally conductive dielectric layer 62. In manufacturing the device 60, the uppermost layers (dielectric layers) of those semiconductor structures are bonded to each other.

FIG. 8 illustrates a schematic cross-sectional view of a semiconductor light-emitting device 70 according to a sixth embodiment.

The device 70 as illustrated in FIG. 8 has substantially the same structure as the device 10 illustrated in FIG. 2, except that wire grid electrodes 71 are provided on the first structural layer 13, and a layer 72 of a silicide of the metal forming the wire grid electrode 71 surrounds the wire grid electrodes 71 and the first structural layer 13 located thereunder. The wire grid electrodes 71 can be formed of, for example, tungsten. In the semiconductor light-emitting device 70, the first light reflection structure has the metal grid electrode 71 (in addition to the first structural layer 13). The surface of the metal grid electrode 71 is flush with the surface of the metal silicide layer (buried layer) 72.

A method for manufacturing the device 70 illustrated in FIG. 8 will be explained with reference to FIGS. 9A to 9C. First, as explained above with reference to FIG. 3C, openings are formed in an amorphous silicon layer 131 provided on a dielectric layer 12 on a substrate 11; a dielectric layer 14 is formed, filling the openings; the dielectric layer 14 is planarized by CMP; the dielectric layer 14 is subjected to patterning for forming the wire grid electrodes; and recesses 141 for embedding the wire grid electrodes-forming metal are provided in the dielectric layer 14 by etching using a mask (FIG. 9A).

Then, the amorphous silicon layer 131 and the dielectric layer 14 are sequentially removed by etching, except for those portions corresponding to the first structural layer 13 to partially expose the surface of the dielectric layer 12 (FIG. 9B).

Thereafter, a metal 82 for forming the grid electrodes is deposited on the dielectric layer 14 remaining on the first structural layer 13, within the recesses 141 formed in the dielectric layer 14, and on the exposed surface of the dielectric layer 12. Then, the deposited metal 82 is planarized by CMP to the level of the surface of the remaining dielectric layer 14. Then, an amorphous silicon layer 83 is formed on the remaining dielectric layer 14, with the metal 82 filled in the recesses, and also on the metal layer 82 located on the dielectric layer 12 (FIG. 9C).

Subsequently, a heat treatment is carried out to react the metal 82 with the amorphous silicon layer 83, siliciding the metal 82 to form a metal silicide layer 72. Then, silicon which has not contributed to the silicidation is removed.

After thus fabricating the semiconductor structure corresponding to the above-noted first semiconductor structure, the semiconductor light-emitting device 50 can be manufactured by the procedures explained with reference to FIGS. 3E, 3F and 3G to 3I.

FIG. 10 schematically illustrates a semiconductor light-emitting device 90 according to a seventh embodiment. Like the semiconductor light-emitting devices illustrated in FIGS. 1, 2, 4, 5, 7 and 8, the device 90 is a vertical cavity surface emitting laser (VCSEL) device. In the device 90 illustrated in FIG. 10, a second light reflection structure comprises, in place of a DBR, a first structural layer whose refractive index changes periodically.

As illustrated in FIG. 10, the device 90 comprises a substrate 91. The substrate 91 may be a similar substrate formed of a semiconductor material which is similar in kind to a semiconductor of an optical semiconductor structure including an active layer (i.e., a light-emitting layer) formed on the substrate 91, or it may be a dissimilar substrate formed of a semiconductor material which is dissimilar in kind from the material of the semiconductor of the above semiconductor layer (for example, a silicon substrate in the case where the semiconductor of the semiconductor layer including the active layer is a Group III-V or II-IV compound semiconductor).

On the substrate 91, a first light reflection structure 93 is provided through a dielectric layer (for example, a silicon oxide layer) 92. The first light reflection structure 93 comprises a first structural layer whose refractive index changes periodically in its in-plane direction. The first structural layer 93 is composed of high refractive-index regions having a relatively high refractive index and low refractive-index regions having a relatively low refractive index, which are two-dimensionally arranged periodically. Such first structural layer 93 may be composed of a thin film of a photonic crystal. Specifically, the first structural layer 93 has, as a matrix, a high refractive-index layer formed of a material having a high refractive index, and dielectric materials having a refractive index lower than that of the matrix are embedded in the matrix at regular intervals. As the matrix, amorphous silicon may be exemplified, and as the dielectric materials, silicon oxide, silicon nitride, silicon oxynitride, aluminum nitride or an aluminum oxide may be exemplified. Referring to FIG. 10, in amorphous silicon constituting a matrix 931, a plurality of through-holes 932 are provided at regular intervals. A dielectric layer 94 covers the amorphous silicon layer 931 and fills the holes 932. The surface of the first structural layer 93 is flush with the surface of the amorphous silicon layer (buried layer) 931 which surrounds the first structural layer 93.

On the dielectric layer 94, an optical semiconductor structure 95 is provided, which includes a first contact layer 951 of a first conductivity type, a first clad layer 952 of the first conductivity type, a first light confinement layer 953 of the first conductivity type, an active layer 954, a second light confinement layer 955 of a second conductivity type, a second clad layer 956 of the second conductivity type and a second contact layer 957 of the second conductivity type. It should be noted that although the clad layers 952 and 956 may be omitted, the light confinement efficiency is further improved if those clad layers are provided. Also, It should be noted that the first conductivity type and the second conductivity type refer to two conductivity types opposite to each other; if one is p-type, the other is n-type, and conversely, if one is n-type, the other is p-type.

On the optical semiconductor structure 95, a second light reflection structure 97 is provided through a dielectric layer 96 such as a silicon oxide layer. In this embodiment, the second light reflection structure 97 comprises a second structural layer 971 whose refractive index changes periodically. The second structural layer 971 is, like the first structural layer 93, composed of high refractive-index regions having a relatively high refractive index and low refractive-index regions having a relatively low refractive index, which are two-dimensionally arranged periodically. Such second structural layer 971 may be composed of a thin film of a photonic crystal. Specifically, the second structural layer 971 has, as a matrix, a high refractive-index layer formed of a material having a high refractive index, and dielectric materials having a refractive index lower than that of the matrix are embedded in the matrix at regular intervals. As the matrix, amorphous silicon may be exemplified, and as the dielectric materials, silicon oxide, silicon nitride, silicon oxynitride, aluminum nitride or an aluminum oxide may be exemplified. Referring to FIG. 10, in the amorphous silicon constituting a matrix 971a, a plurality of through-holes 971b are provided at regular intervals. A dielectric layer 98 covers the amorphous silicon layer 971a and fills the holes 971b.

In the optical semiconductor structure 95, a current constriction layer 99 is provided. The current constriction layer 99 constricts current passing through the semiconductor laser in order to reduce a reactive current which diffuses within the semiconductor laser, and defines the light emission region including the active layer 954.

The current constriction layer 99 includes high resistance regions 991 having a relatively high electrical resistance and low resistance regions 992 having a relatively low electrical resistance. As viewed in a plan view, the high resistance regions 991 and the low resistance region 992 are arranged at a period corresponding to the period at which the refractive index of the second structural layer 971 changes. More specifically, the low resistance regions 992 are each formed of the semiconductor of the optical semiconductor structure 95, and the high resistance region 991 is formed of the above semiconductor, which has been implanted with ions. The ion implantation may be conducted by proton implantation. In the ion-implanted region (the high resistance region) 991, implanted ions are scattered to diffuse in the optical semiconductor structure 95, and thus in a lower region of the optical semiconductor structure 95, all the high resistance regions 991 are united, resulting in a region in which current does not easily flow. A center portion of the optical semiconductor structure 95 (resonator portion) is not ion-implanted. Thus, current flows through an upper region of the high resistance region 991, the low resistance regions 992, the region in which the current constriction layer 99 is not formed, and the active layer 954 located therein, and then flows into the first contact layer 951 of the first conductivity type. As a result, the regions in which the current flows are all located in a center portion of the mesa region. This distribution of those regions is coincident with the distribution of light resonated in the semiconductor light-emitting device. Thus, the current injection efficiency is improved, and the device can be operated with lower power consumption. That is, as described above, in the current constriction layer 99, low resistance regions are located periodically, as a result of which a contact resistance to an electrode 1002, the power consumption and self-heating are all reduced, as compared to a current constriction layer entirely formed of high resistance region (formed by, for example, proton implantation conducted on the entire current constriction layer formation portion of the semiconductor layer).

The structure comprising the dielectric layer 96, the second structural layer 971 and the dielectric layer 98 covers the entire surface of the optical semiconductor structure 95 and a portion of the surface of the current constriction layer 99. That is, the other portion of the surface of the current constriction layer 99 is exposed from the structure comprising the dielectric layer 96, the dielectric layer 96, the second structural layer 971 and the dielectric layer 98.

The semiconductor light-emitting device 90 is further provided with a pair of electrodes for supplying current to the optical semiconductor structure 95. One of the electrodes, an electrode 1001, is in contact with a surface of the first contact layer 951 in the optical semiconductor structure 95, and is also in contact with a surface of the substrate 91 through the dielectric layer 92, the first structural layer 93, the dielectric layer 94 and the first contact layer 951.

It should be noted that a metal layer 1002 is provided to cover the entire surface of the structure comprising the dielectric layer 96, the second structural layer 971 and the dielectric layer 98, and also contact with the above-mentioned exposed surface of the current constriction layer 99. The metal layer 1002 further increases the refractive index of the second light reflection structure 97 including the second structural layer 971, and also doubles as the other of the pair of electrodes. The refractive index of the second light reflection structure 97 comprising the second structural layer 971 can be increased to approximately 99.9% owing to provision of the metal layer 1002. The material of the metal layer 1002 can be selected in accordance with the kind of light emitted from the laser. For example, when the emitted light is visible light, the metal layer 1002 may be formed of silver. When the emitted light is near-infrared light, the metal layer 1002 may be formed of gold, aluminum or copper.

The metal layer 1002 is provided above the second structural layer 971 so as to cover the entire surface of the structural layer 971. Thus, light produced at the active layer 954 can be output from the substrate 91. That is, the light produced at the active layer 954 is amplified while it reciprocates repeatedly between the two light reflection structures 93 and 97, and is emitted through the reflection layer 93 in a direction perpendicular to the surface of the substrate 91. In this case, in order for the light produced at the active layer 954 to be transmitted through the substrate 91, the substrate 91 is formed of a semiconductor material having a bandgap energy higher than that of the semiconductor material of the active layer. For example, in the case where the active layer is formed of a Group III-V compound semiconductor or a Group II-IV compound semiconductor, the substrate 91 may be formed of silicon.

In the semiconductor light-emitting device 90, the active layer 954 is narrower than the first light reflection structure 93. In other words, the surface area of the active layer 954 is smaller than the surface area of the first light reflection structure 93.

In the semiconductor light-emitting device 90 explained above, each of the first structural layer and the second structural layer, which constitute the light reflection structures, is of a structural layer in which the high refractive-index regions and the low refractive-index regions are two-dimensionally arranged; however, one or both of the two light reflection structures may be a structural layer in which high refractive-index regions and the low refractive-index regions is one-dimensionally arranged, for example DBR described with reference to FIGS. 1 and 2.

Next, a method for manufacturing the semiconductor light-emitting device as illustrated in FIG. 10 will be explained with reference to FIGS. 11A to 11K. This method is an example of a method for manufacturing the semiconductor laser device as illustrated in FIG. 10 wherein the substrate 91 is formed of a dissimilar substrate formed of a semiconductor material dissimilar in kind from the semiconductor material of the optical semiconductor structure 95.

As illustrated in FIG. 11A, on the dissimilar substrate 91 such as a silicon substrate or the like, a dielectric layer (for example, a silicon oxide layer) 92, an amorphous silicon layer 931 and a dielectric layer (for example, a silicon oxide layer) 1011 are formed.

Next, the dielectric layer 1011 is patterned. Using the patterned dielectric layer 1011 as a mask, the amorphous silicon layer 931 is wet- or dry-etched, to provide holes 132 at regular intervals in the amorphous silicon layer 931 (FIG. 11B).

Thereafter, without removing the dielectric layer 1011 used as the mask, another dielectric layer is formed on the entire surface of the dielectric layer 1011 so as to fill the holes 932 of the amorphous silicon layer 931 (the other dielectric layer noted above and the dielectric layer 1011 used as the mask will be hereinafter collectively illustrated and referred to as a dielectric layer 941). Then, the dielectric layer 941 is planarized by CMP. In this case, this planarization is performed such that the dielectric layer 941 remains to have a thickness sufficient for boding to be described later. In this way, a first structural layer 93 is formed in which dielectrics (the dielectrics forming the dielectric layer 941) having a refractive index different from that of amorphous silicon are embedded periodically (FIG. 11C). The semiconductor structure provided with the first structural layer 93 will be referred to as a first semiconductor structure.

On the other hand, on a similar substrate (for example, a Group III-V compound semiconductor substrate) 300, a optical semiconductor structure 95 is formed, which includes the second contact layer 957 of the second conductivity type, the second clad layer 956 of the second conductivity type, the second light confinement layer 955 of the second conductivity type, the active layer 954, the first light confinement layer 953 of the first conductivity type, the first clad layer 952 of the first conductivity type, and the first contact layer 951 of the first conductivity type (the optical semiconductor structure 95 may be formed of, for example, Group III-V compound semiconductors). Then, on the first contact layer 951 of the first conductivity type, a dielectric layer 942 for bonding is formed (FIG. 11D). Thus, a semiconductor structure provided with the optical semiconductor structure 95 including the active layer is obtained, and will be hereinafter referred to as a second semiconductor structure.

Next, the second semiconductor structure is stacked on the first semiconductor structure such that their dielectric layers 941 and 942 contact each other, and both semiconductor structures are bonded. The dielectric layers 941 and 942 are combined into a dielectric layer 94 as illustrated in FIG. 10 (FIG. 11E). The structure thus obtained will be hereinafter referred to as a third semiconductor structure.

Next, from the third semiconductor structure, the similar substrate 300 is removed by mechanical polishing or wet etching. Thus, the second contact layer 957 is exposed (FIG. 11F).

Figure 11G:
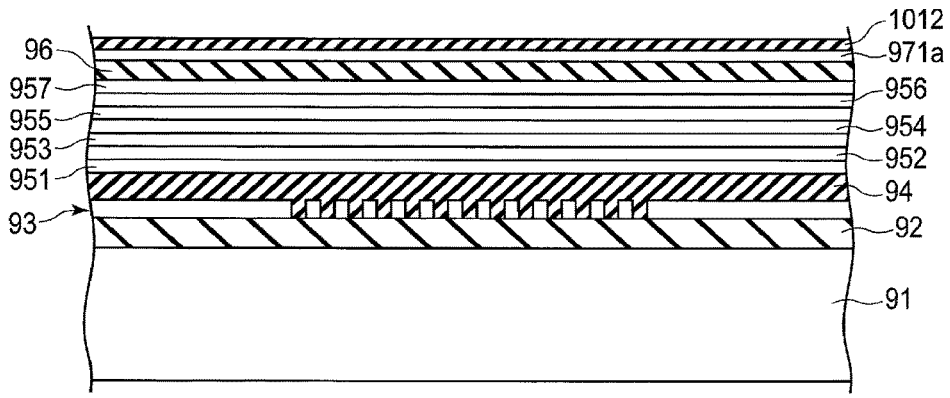

On the exposed second contact layer 957, a dielectric layer 96, an amorphous silicon layer 971*a* and a dielectric layer 1012 are successively formed (FIG. 11G).

Then, the dielectric layer 1012 is patterned, and the amorphous silicon layer 971*a* is etched using the patterned dielectric layer 1012 as a mask. As a result, holes 171*b* are formed in the amorphous silicon layer 971*a* at regular intervals. Then, the dielectric layer mask is removed.

Figure 11H:
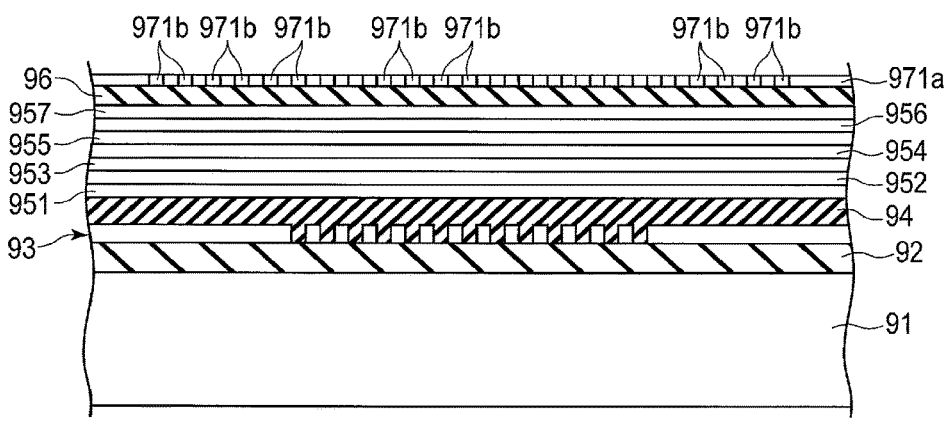
Figure 11I:
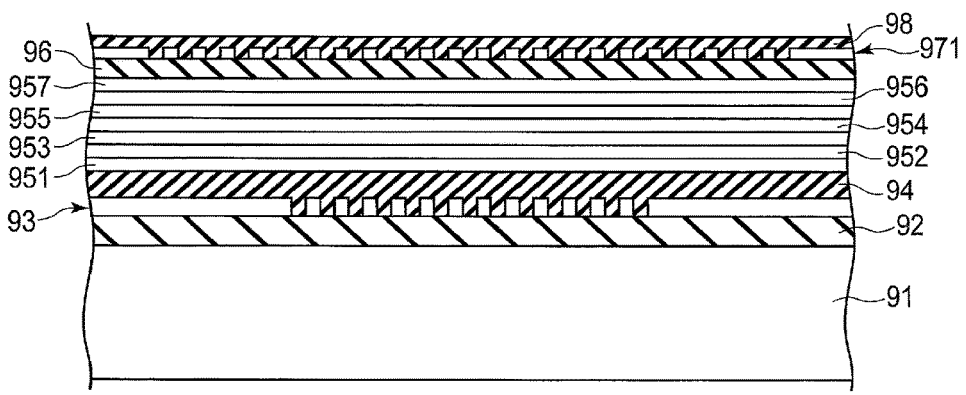

Thereafter, a dielectric layer 98 is formed on the amorphous silicon layer 971*a* and in the holes 971*b* in the amorphous silicon layer 971*a*. Then, the dielectric layer 98 layer is planarized by CMP. As a result, a second structure 971 is formed in which the dielectrics, which have a refractive index different from that of amorphous silicon, are embedded in the amorphous silicon layer 971*a* periodically or at intervals (FIG. 11I).

Next, ion implantation is performed on a current constriction layer formation portion in the optical semiconductor structure 95 including the active layer 954. The ion implantation is, for example, proton implantation. In this case, proton ions are blocked at the amorphous silicon portions of the second structural layer 971, but they are transmitted through the dielectric portions of the second structural layer 971. The portions into which proton ions are implanted have a resistance higher than that of the portions in which proton ions are not implanted. That is, as viewed in a plan view, the low resistance regions 992 which comprises the semiconductor of the optical semiconductor structure 95 including the active layer 954 and the high resistance regions 991 which have an electrical resistance higher than that of the semiconductor are two-dimensionally arranged at a period corresponding to the period at which the refractive index of the second structural layer 971 changes. In the ion-implanted regions (high resistance regions) 191, the implanted ions are scattered to diffuse in the optical semiconductor structure 95, and thus in a lower region of the optical semiconductor structure 95, all the high resistance regions 991 are united, resulting in a region in which current does not easily flow. This region or structure provides the current constriction layer 99 (FIG. 11J). The current constriction layer 99 may be annular in shape.

Next, the dielectric layer 98, the second structural layer 971 and the dielectric layer 96 are successively etched to partially expose the surface of the current constriction layer and to mesa-process them into the same truncated cone. Then, the optical semiconductor structure 95 is mesa-processed into a truncated cone, except for the first contact layer 951 and the current constriction layer 99 (FIG. 11K).

Thereafter, electrodes 1001 and 1002 are formed, thereby finishing a semiconductor light-emitting device having a structure as illustrated in FIG. 10. Needless to say, the optical semiconductor structure 95 defined by the current constriction layer 99, and upper and lower light reflection structures, i.e., the second light reflection structure 97 and the first light reflection structure 93, constitute an optical resonator.

According to the manufacturing method explained with reference to FIGS. 11A to 11K, the finished semiconductor light-emitting device includes the optical semiconductor structure 95, which is formed of a Group III-V compound semiconductor, on the dissimilar substrate (for example, silicon substrate) 11 as described above; however, since the optical semiconductor structure 95 was formed on the similar substrate 300, lattice match is achieved. Therefore, it is not necessary to pay attention to lattice mismatch which would occur, for example, in the case where a Group III-V compound semiconductor layer is grown on a dissimilar substrate. In other words, according to the above method, it is not necessary to apply a heteroepitaxial growth.

Examples of the Group III-V compound semiconductor forming the semiconductor layer including the active layer are listed below:

<InP-Based Semiconductor (No. 1)>
active layer: multiple quantum well structure of InGaAsP and InGaAsP which have different composition ratios of In
first and second light confinement layers: InGaAsP or InP
first and second clad layers: InGaAsP or InP
first and second contact layers: InP or InGaAs
light-emission wavelength band: 1.2 to 1.7 μm.

<InP-Based Semiconductor (No. 2)>
active layer: multiple quantum well structure of InGaAlAs and InGaAlAs which have different composition ratios of In
first and second light confinement layers: InGaAlAs or InGaAsP or InP
first and second clad layers: InGaAlAs or InP
first and second contact layers: InP or InGaAs
light-emission wavelength band: 1.3 μm.

<GaAs-Based Semiconductor (No. 1)>
active layer: multiple quantum well structure of InGaAs and GaAs
first and second light confinement layers: AlGaAs or GaAs
first and second clad layers: AlGaAs or GaAs
first and second contact layers: AlGaAs or GaAs
light-emission waveband: 0.9 to 1.15 μm.

<GaAs-Based Semiconductor (No. 2)>
active layer: multiple quantum well structure of InGaAs and GaAs
first and second light confinement layers: AlGaAs or GaAs
first and second clad layers: AlGaAs or GaAs
first and second contact layers: GaAs
light-emission waveband: 0.62 to 0.87 μm.

<GaAs-Based Semiconductor (No. 3)>
active layer: multiple quantum well structure of AlGaInP and GaAs
first and second light confinement layers: AlGaInP or AlGaAs or GaAs
first and second clad layers: AlGaInP or GaAs
first and second contact layers: GaAs
light-emission wavelength band: 0.54 to 0.7 μm.
<GaN-Based Semiconductor>
active layer: multiple quantum well structure of InGaN and AlGaN
first and second light confinement layers: AlGaN or GaN
first and second clad layers: AlGaN or GaN
first and second contact layers: GaN or InGaN
light-emission wavelength band: 0.3 to 0.6 μm.

The semiconductor layer can also be formed of, for example, a Group II-VI compound semiconductor such as ZnSe-based semiconductors, e.g., CdZnSSe.

Furthermore, examples of metal material of which the electrodes are formed are listed below.
<For InP-Based Semiconductor Layer>
p-electrode: three-layer structure of Ti, Pt and Au, two-layer structure of An and Au, or the like
n-electrode: three-layer structure of Ti, Pt and Au or the like.
<For GaAs-Based Semiconductor Layer>
p-electrode: three-layer structure of Ti, Pt and Au, or the like
n-electrode: three-layer structure of AuGe, Ni and Au, or the like.

Furthermore, the thickness of the amorphous silicon layer 931 is, for example, 0.2 to 0.5 μm, and the thickness of the amorphous silicon layer 971a is, for example, 0.2 to 0.5 μm.

The thickness of each of the first and second contact layers 951 and 957 forming the optical semiconductor structure 95 is, for example, 0.2 to 1.5 μm, the thickness of each of the first and second clad layers 952 and 956 is, for example, 0.1 to 0.5 μm, the thickness of each of the first and second confinement layers 953 and 955 is, for example, 0.05 to 0.2 μm, and the thickness of the active layer 954 is, for example, 0.05 to 0.2 μm. The diameter of the aperture defined by the current constriction layer 99 is, for example, 5 to 20 μm.

It should be noted that based on the method of manufacturing the semiconductor light-emitting device according to the second embodiment explained with reference to FIGS. 3A to 3I, a semiconductor light-receiving device can be manufactured on the same substrate (common substrate) at the same time as the semiconductor light-emitting device. Explained below is an example of a method for manufacturing an optical semiconductor device (an optical semiconductor device according to an eighth embodiment) in which such a semiconductor light-emitting device and a semiconductor light-receiving device as described above are formed on the same substrate.

As illustrated in FIG. 12A, on a dissimilar substrate (for example, silicon substrate) 2011 like the substrate 11 illustrated in FIG. 2, a first structural layer 2013a (whose refractive index changes periodically) of a light-emitting device and a lower structural layer 2013b (whose refractive index changes periodically) of a light-receiving device, which is separated from the first structural layer 2013a, are formed according to the procedures explained with reference to FIGS. 3A to 3C and 3D. The structural layers 2013a and 2013b are provided on dielectric layers 2012a and 2012b, respectively; the laminate of the dielectric layer 2012a and the structural layer 2013a and the laminate of the dielectric layer 2012b and the structural layer 2013b are surrounded by an amorphous silicon layer 2015. Needless to say, in the structural layers 2013a and 2013b, high refractive-index region formed of amorphous silicon and low refractive-index regions formed of dielectric layers filled in holes formed in the amorphous silicon are two-dimensionally arranged periodically. Light from the light-emitting device is incident on the first structural layer 2013b of the light-receiving device. The semiconductor structure thus obtained (the semiconductor structure illustrated in FIG. 12A) will be hereinafter referred to as a first semiconductor structure.

Next, according to the procedures explained with reference to FIG. 3E, on a similar substrate (for example, a Group III-V compound semiconductor substrate) 3000, a semiconductor layer 3172 and a semiconductor layer 3171 having different refractive indices are stacked one upon another, thereby forming a semiconductor multilayer reflective film (DBR) 3170. Then, on the DBR 3170, a second clad layer 3165, a second light confinement layer 3164, an active layer 3163, a first light confinement layer 3162 and a first clad layer (doubling as a contact layer) 3161 are stacked to form a semiconductor layer 3160. Thus, a semiconductor structure (second semiconductor structure) provided with the semiconductor layer 3160 including the active layer is obtained. Next, the first semiconductor structure and the second semiconductor structure are bonded to each other such that the surface of the first semiconductor structure which includes surfaces of the first structural layers 2013a and 2013b faces the first clad layer 3161 in the second semiconductor structure. In the case where the first clad layer 3161 is formed of InP, it can be directly bonded to the amorphous silicon layer 2015. The structure thus obtained will be hereinafter referred to as a third semiconductor structure (FIG. 12B).

Figure 12C:
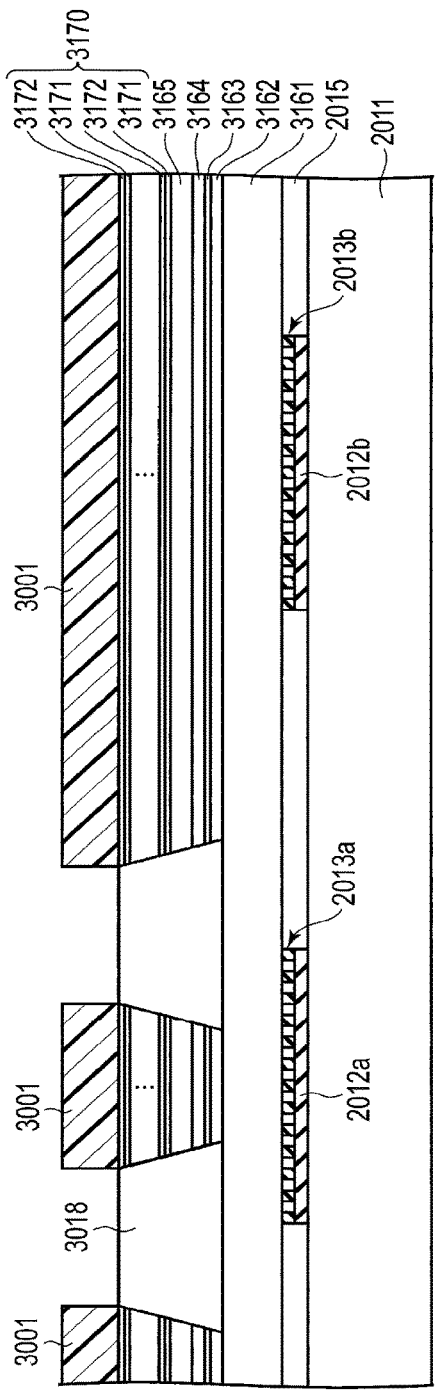

Next, from the third semiconductor structure, the similar substrate 3000 is removed by mechanical polishing or wet etching to expose a surface of the DBR 3170 (with an uppermost layer 3172). Next, a mask 3001 is formed on the entire surface of the DBR 3170 except for the surface of a current constriction layer of the formation portion in the semiconductor layer 3160 of the light-emitting device. Ion implantation is performed on the current constriction layer formation portion. The ion implantation is, for example, proton implantation. By the ion implantation, a current constriction layer 3018 is formed in the semiconductor layer 3160 including the DBR 3170 in the light-emitting device region (FIG. 12C). The current constriction layer 3018 may be annular in shape.

Figure 12D:
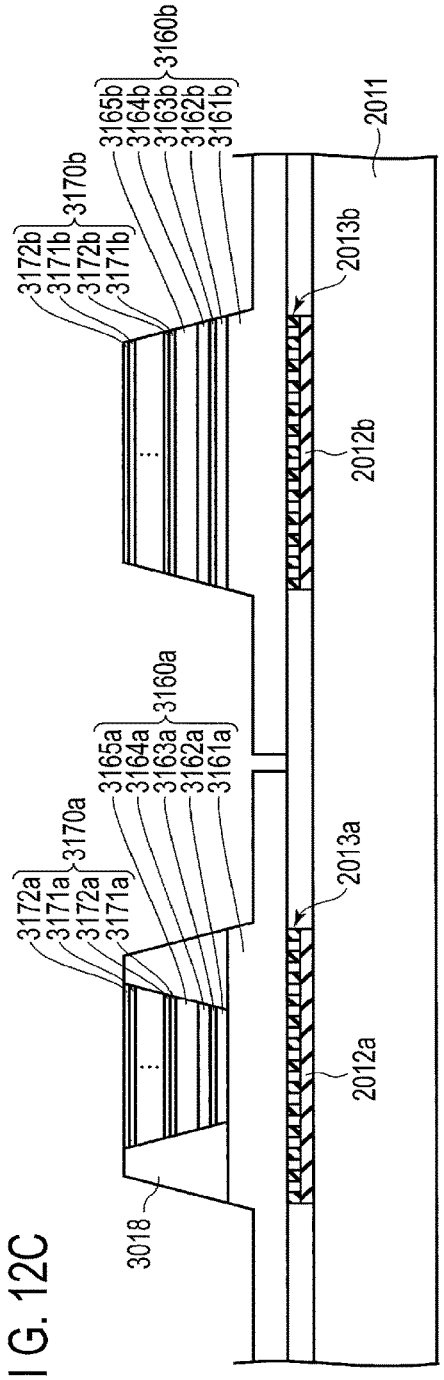

Next, according to the procedures explained with reference to FIG. 3I, after removing the mask 3001, the current constriction layer 3018 is mesa-processed, and the semiconductor layer and the DBR of the light-emitting device are mesa-processed, including a portion of the first clad layer 3161, both into truncated cones. Further, the first clad layer 3161 is divided such that the light-emitting device and the light-receiving device are separated from each other. In this way, the first clad layer 3161 is separated into the first clad layer 3161a in the light-receiving device and the first clad layer 3161b in the light-receiving device. Also divided into the semiconductor layer 3160 including the first light confinement layer 3162, the active layer 3136, the second light confinement layer 3164 and the second clad layer 3162, as well as the DBR 3170 comprising the laminate of the semiconductor layers 3117 and 3172 having different refractive indexes are separated into a semiconductor layer 3160a including a first light confinement layer 3162a, an active layer 3163a, a second light confinement layer 3164a and a second clad layer 3165a, and a DBR 3170a comprising the laminate of semiconductor layers 3171a and 3172a having different refractive indices in the light-emitting device, and a semiconductor layer 3160b including a first light confinement layer 3162b, an active layer 3163b, a second light confinement layer 3164b and a second clad layer 3165b, and a DBR 3170b comprising a laminate of semiconductor layers 3171b and 3172b having different refractive indexes in the light-receiving device (FIG. 12D).

Figure 12E:
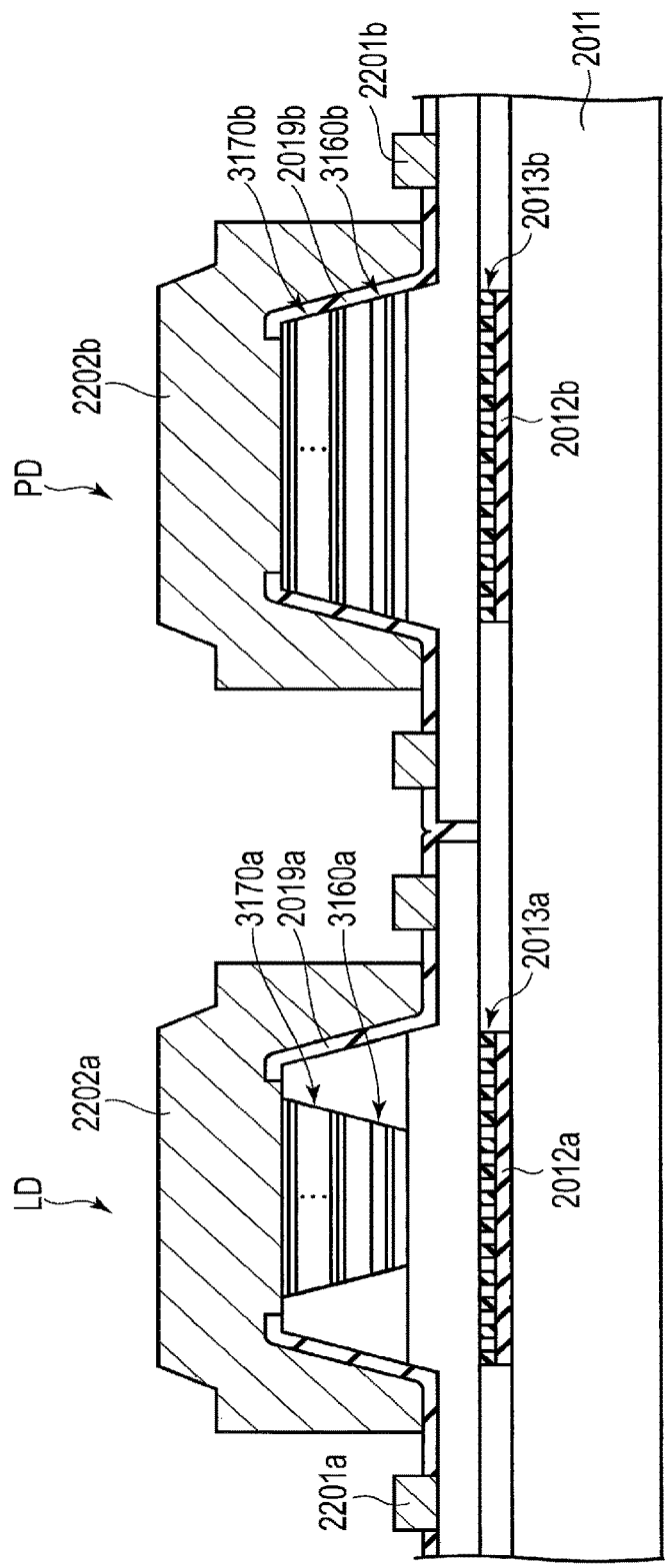

Finally, according to the procedures explained with reference to FIG. 3I, an insulating film 2019a and an insulating film 2019b, as well as electrodes 2201a and 2202a, and electrodes 2201b and 2202b are provided on the light-emitting device structure and the light-receiving device structure, respectively. Thus, an optical semiconductor device is manufactured, in which the semiconductor light-emitting device (laser diode) LD and a semiconductor light-receiving device (photodiode) PD are provided on the same substrate (FIG. 12E).

As can be seen from the above explanation, the semiconductor light-emitting device LD illustrated in FIG. 12E has the same structure as the semiconductor light-emitting device 10 explained with reference to FIG. 2. Furthermore, the semiconductor layer 3160a in the semiconductor light-emitting device LD and the semiconductor layer 3160b in the semiconductor light-receiving device PD are the same in layer construction and materials. Likewise, the DBR 3170a in the semiconductor light-emitting device LD and the DBR 3170b in the semiconductor light-receiving device are the same in layer construction and materials. The matrixes and the dielectric materials forming the first structural layers 2013a and 2103b are the same; however, the periods at which the refractive index changes may be different.

Further, according to the method of manufacturing the semiconductor light-emitting device according to the seventh embodiment, explained with reference to FIGS. 11A to 11K, a semiconductor light-receiving device can be manufactured on the same substrate (common substrate) at the same time as a semiconductor light-emitting device. Explained below is an example of a method for manufacturing an optical semiconductor device (an optical semiconductor device according to an ninth embodiment) in which such a semiconductor light-emitting device and a semiconductor light-receiving device are formed on the same substrate.

As illustrated in FIG. 12A, on a dissimilar substrate (for example, silicon substrate) 4091, like the substrate 91 illustrated in FIG. 10, a dielectric layer 4092 is formed, and an amorphous silicon layer 4931 and a dielectric layer for use as a mask (not illustrated) are formed, and then the dielectric layer for use as the mask is patterned, according to the procedures explained with reference to FIGS. 11A to 11C. Using the patterned dielectric layer as a mask, holes are provided at regular intervals in a portion of the amorphous silicon layer 4931 in a light-emitting device region and another portion of the amorphous silicon layer 4931 in a light-receiving device region. Without removing the mask, a dielectric layer is formed on the entire surface of the mask and within the holes (the dielectric layer and the mask will be hereinafter collectively referred to as a dielectric layer 4941). Thus, a lower (first) structural layer 4093a of the light-emitting device and a lower (first) structural layer 4093b of the light-receiving device are formed apart from each other. Needless to say, in the structural layers 4093a and 4093b, high refractive-index regions formed of amorphous silicon and low refractive-index regions formed of dielectric layers 4941 filled in holes formed in the amorphous silicon layer 4931 are two-dimensionally arranged periodically. Light from the light-emitting device is incident on the first structural layer 4093b of the light-receiving device. The semiconductor structure thus obtained (the semiconductor structure illustrated in FIG. 12A) will be hereinafter referred to as a semiconductor structure A.

Next, as explained above with reference to FIGS. 11D to 11E, on a similar substrate 5000, a semiconductor layer 4950 including a second contact layer 4957 of the second conductivity type, a second clad layer 4956 of the second conductivity type, a second light confinement layer 4955 of the second conductivity type, an active layer 4954, a first light confinement layer 4953 of the first conductivity type, a first clad layer 4952 of the first conductivity type, and a first contact layer 4951 of the first conductivity type is formed, and on the first contact layer 4951 of the first conductivity type, a dielectric layer 4942 for bonding is formed to obtain a semiconductor structure B. Then, on the semiconductor structure A, the semiconductor structure B is stacked such that their dielectric layers 4941 and 4942 contact with each other, and the both semiconductor structures are bonded to each other. The dielectric layers 4941 and 4942 are combined to constitute a dielectric layer 4940 (FIG. 13B).

Next, according to the procedures explained with reference to FIGS. 11G to 11I, from the bonded semiconductor structures, the similar substrate 5000 is removed by mechanical etching or wet etching to expose the surface of the second contact layer 4957, and then a dielectric layer 4960, an amorphous silicon layer 4971 and a dielectric layer for use as a mask (not illustrated) are successively formed thereon. Then, the dielectric layer for use as a mask is patterned, and the amorphous silicon layer 4971 is etched using the patterned dielectric layer as a mask. Thus, holes are formed at regular intervals in a portion of the amorphous silicon layer 4971 in the light-emitting device region and also in another portion of the amorphous silicon layer 4971 in the light-receiving device region. Thereafter, without removing the dielectric layer used as the mask, another dielectric layer is formed on the entire surface of the dielectric layer used as the mask and within the holes in the amorphous silicon layer 4971 (the above other dielectric layer and the dielectric layer used as the mask will be hereinafter collectively referred to as a dielectric layer 4098). Then, the dielectric layer 4098 is planarized by CMP. Thus, second structures 4097a and 4097b are formed, in which the dielectrics having a refractive index different from that of the amorphous silicon are embedded in the amorphous silicon layer 4971 (FIG. 13C).

Next, according to the procedures explained with reference to FIG. 11J, ion implantation is performed on a current constriction layer formation portion in the semiconductor layer 4950 in the light-emitting device region. The ion implantation is, for example, proton implantation. In this case, proton ions are blocked at the amorphous silicon portion of the second structural layer 4097a, but they are transmitted through the dielectrics filled in the holes formed in the amorphous silicon layer 4971. The portion into which proton ions are implanted has an electrical resistance higher than that of the portion into which proton ions are not implanted. That is, a structure is obtained, in which as viewed in a plan view, low resistance regions 4992 which comprise the semiconductor of the semiconductor layer 4950 including the active layer 4954 and a high resistance region 4991 which have a electrical resistance higher than that of the semiconductor are two-dimensionally arranged at a period corresponding to the period at which the refractive index of the second structural layer 4097a changes. In the ion-implanted region (the high resistance region) 4991, implanted ions are scattered to diffuse in the semiconductor layer 4950, and thus in a lower region of the semiconductor layer 4950, all the high resistance regions 4991 are united, resulting in a region in which current does not easily flow. This region or structure provides the current constriction layer 4990 (FIG. 13D). The current constriction layer 4990 may be annular in shape. Needless to say, the ion implantation noted above is not performed on the light-receiving device region.

Next, according to the procedures explained with reference to FIG. 11K, the dielectric layer 4098, the second structural layer 4097a and the dielectric layer 4960 in the light-emitting device region, as well as the dielectric layer 4098, the second structural layer 4097b and the dielectric layer 4960 in the light-receiving device region are mesa-processed by sequential etching into truncated cones, respectively. Then, the semiconductor layer 4950 in the light-emitting device region is mesa-processed into a truncated cone, except for the first contact layer 4951 and the current constriction layer 4990 in the light-emitting device region, and the semiconductor layer 4950 in the light-receiving device region is mesa-processed into a truncated cone, except for the first contact layer 4951 in the light-receiving device region. Subsequently, a pair of electrodes 5011a and 5011b in the light-emitting device and a pair of electrodes 5011b and 5012b in the light-receiving device are formed. Thus, an optical semiconductor device is manufactured, in which the semiconductor light-emitting device (laser diode) LD and the semiconductor light-receiving device (photo diode) PD are provided on the same substrate (FIG. 13E).

Figure 13A:
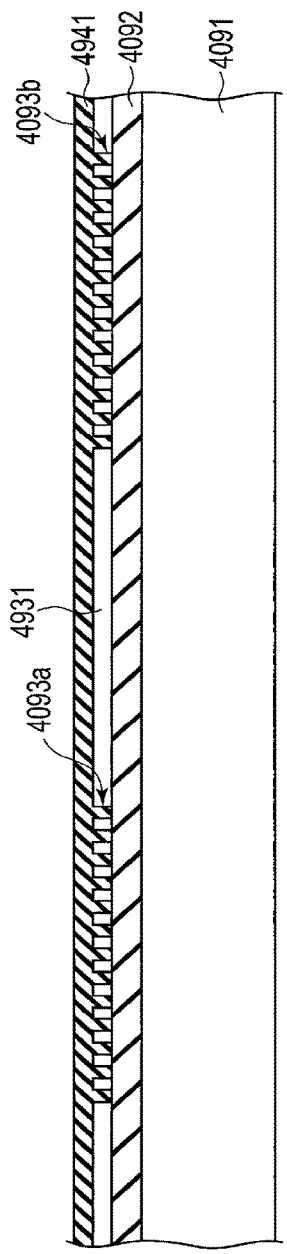
Figure 13B:
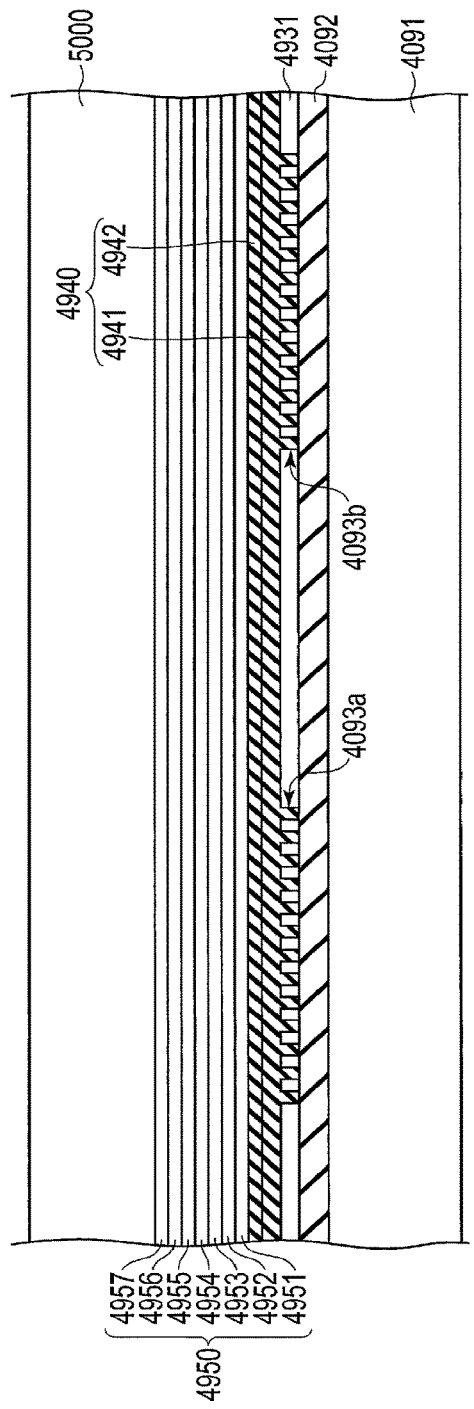
Figure 13C:
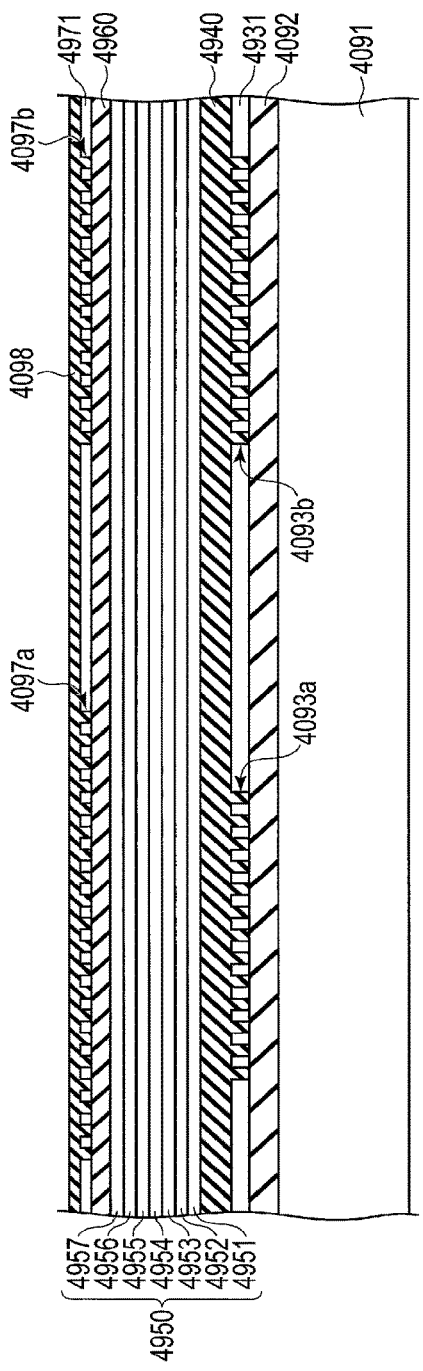
Figure 13D:
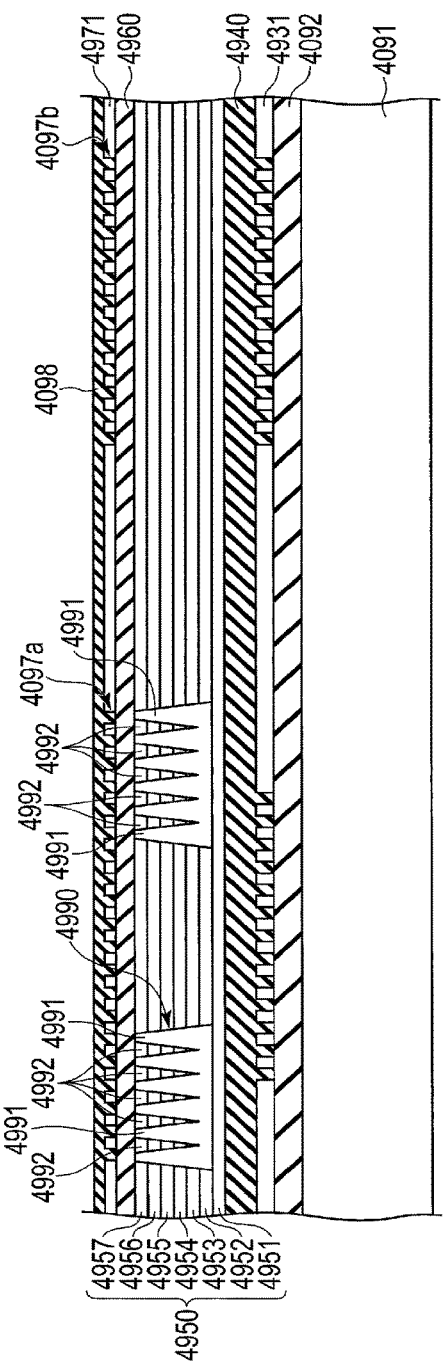

In FIG. 13E illustrating the finished optical semiconductor device, the dielectric layers 4092 and 4940, the first contact layer 4951, and the dielectric layers 4960 and 4098 in the light-emitting device LD are illustrated as the dielectric layers 4092a and 4940a, the first contact layer 4951a, the dielectric layers 4960a and 4098a, respectively. Likewise, the dielectric layers 4092 and 4940, the first contact layer 4951, and the dielectric layers 4960 and 4098 in the light-receiving device PD are illustrated as the dielectric layers 4092b and 4940b, the first contact layer 4951b, and the dielectric layers 4960b and 4098b, respectively. It should be noted that the electrode 5012b in the light-receiving device, like the electrode 5012a in the light-emitting device, is formed on the entire surface of the second structural layer 4097b, constituting a light reflection structure together with the second structural layer 4097b.

Needless to say, the semiconductor light-emitting device LD and the semiconductor light-receiving device PD are separated from each other. The active layer in the semiconductor light-emitting device LD functions as a light-emitting layer, while the active layer in the semiconductor light-receiving device PD functions as a light-absorbing layer.

As can be seen from the above explanation, the semiconductor light-emitting device LD has the same structure as the semiconductor light-emitting device 90 explained with reference to FIG. 10. Furthermore, the semiconductor layer in the semiconductor light-emitting device LD and the semiconductor layer in the semiconductor light-receiving device PD are the same in layer construction and materials. Also, the first and second structural layers are the same in the matrixes and the dielectric materials; however, the periods at which the refractive index of the first structural layer changes may differ from the period at which the refractive index of the second structural layer changes.

Incidentally, each of the optical semiconductor devices illustrated in FIGS. 12E and 13E may have the semiconductor light-emitting device 1 illustrated in FIG. 1, instead of the semiconductor light-emitting device LD.

Thus, an optical semiconductor device according to one embodiment may be described, according to one aspect, as comprising a semiconductor light emitting layer and a semiconductor light-receiving device on the same substrate.

In one embodiment, the semiconductor light-emitting device in the optical semiconductor device comprises a first light reflection structure provided in contact with the substrate, a buries layer which surrounds the first light reflection structure, an optical semiconductor structure including an active layer, provided above the first light reflection structure, a second light reflection structure provided above the optical semiconductor structure, and a pair of electrodes which supply current to the optical semiconductor structure. The surface of the first light reflection structure and the surface of the buried layer are included in the same plane.

In another embodiment, the semiconductor light-emitting device in the optical semiconductor device noted above comprises an optical semiconductor structure including an active layer (light emitting layer) provided on the substrate, a first light reflection structure provided between the substrate and the semiconductor layer, a second light reflection structure provided above the semiconductor layer, and a current constriction layer provided in the semiconductor layer, wherein the first light reflection structure comprises a first structural layer whose refractive index changes periodically, and the second light reflection structure comprises a second structural layer whose refractive index changes periodically. The current constriction layer includes high resistance regions having a relatively high electrical resistance and low resistance regions having a relatively low electrical resistance. The high resistance region and the low resistance regions are arranged at a period corresponding to the period at which the refractive index of the second structural layer changes. The semiconductor light-emitting device further comprises a pair of electrodes which supply current to the semiconductor layer, and one of the electrodes is in contact with a portion of the surface of the current constriction layer.

In addition, the semiconductor light-receiving device in the optical semiconductor device comprises an optical semiconductor structure including an active layer (light-absorbing layer) provided on the substrate, a first light reflection structure which is provided between the substrate and the semiconductor layer, of which refractive index changes periodically and into which light is incident from the substrate side, a light reflection structure which is provided above the semiconductor layer and comprises a second structural layer whose refractive index changes periodically, and a pair of electrodes which supply current to the semiconductor layer.

The semiconductor layer in the semiconductor light-emitting device and the semiconductor layer in the semiconductor light-receiving device have the same layer construction and are formed of the same semiconductor materials.

In the embodiments explained above, the current constriction structures with which the semiconductor layers including the active layer are provided are provided by the current constriction layers formed by the ion implantation conducted on the semiconductor layers including active layers; however current constriction layers should not be limited thereto. For example, a current constriction layer can be provided in the semiconductor layer by oxidation. For example, a layer for oxidation (for example, an AlGaAs layer in a GaAs based light-emitting device, which has a thickness of, for example, 50 to 100 nm, or for example, InAlAs in an InP-based light-emitting device, which has a thickness of, for example, 50 to 100 nm) is interposed between the light confinement layer and the clad layer, and is oxidized by steam oxidation to form a current constriction layer. Alternatively, a current constriction structure can be provided by forming a semi-insulating semiconductor (for example, undoped GaAs in a GaAs-based light-emitting device, or Fe-doped InP or Ru-doped InP in an InP-based light-emitting device) surrounding the semiconductor layer (and a DBR) processed to have a high-mesa structure. Furthermore, a current constriction structure can be provided by forming an insulating polymer (for example, polyimide) surrounding the semiconductor layer (and the DBR) processed to have a high-mesa structure. Moreover, the current constriction structure can also be provided simply by processing the semiconductor layer (and the DBR) to have a high-mesa structure (having a mesa width of, for example, 2 to 10 μm).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor light-emitting device comprising:
   a silicon substrate;
   a first light reflection structure provided in contact with the silicon substrate;
   a buried layer made of silicon, being in contact with the silicon substrate, and surrounding the first light reflection structure;
   an optical semiconductor structure including an active layer, provided above the first light reflection structure;
   a second light reflection structure provided above the optical semiconductor structure; and
   a pair of electrodes which supply current to the optical semiconductor structure,
   wherein a surface of the first light reflection structure and a surface of the buried layer are included in the same plane, and
   a bottom layer of the optical semiconductor structure is in contact with the first light reflection structure and the buried layer.

2. The semiconductor light-emitting device according to claim 1, wherein one or both of the first and second light reflection structures include a structural layer whose refractive index changes periodically in its in-plane direction.

3. The semiconductor light-emitting device according to claim 1, wherein a semiconductor material of the optical semiconductor structure is different from the silicon substrate.

4. The semiconductor light-emitting device according to claim 1, wherein the active layer is narrower than the first light reflection structure.

5. The semiconductor light-emitting device according to claim 1, wherein the active layer is wider than the first light reflection structure.

6. The semiconductor light-emitting device according to claim 1, wherein the active layer is surrounded by an ion-implanted semiconductor.

7. The semiconductor light-emitting device according to claim 1, wherein the optical semiconductor structure comprises Group III-V compound semiconductor.

8. The semiconductor light-emitting device according to claim 1, further comprising a metal layer as an upper layer of the second light reflection structure, the metal layer doubling as one of the electrodes.

9. The semiconductor light-emitting device according to claim 1, wherein the first light reflection structure further comprises a transparent electrode, and a metal layer is provided on the substrate, surrounding the transparent electrode to electrically connect with the transparent electrode.

10. The semiconductor light-emitting device according to claim 1, wherein the first light reflection structure further comprises a metal grid electrode.

11. The semiconductor light-emitting device according to claim 1, wherein a heat-dissipating metal is buried in the substrate, surrounding a region corresponding to the first light reflection structure.

12. The semiconductor light-emitting device according to claim 1, further comprising a thermally conductive dielectric layer between the substrate and the first light reflection structure, and/or between the first light reflection structure and the optical semiconductor structure.

13. The semiconductor light-emitting device according to claim 6, wherein the optical semiconductor structure includes a current constriction structure, and the current constriction structure is constituted by a current constriction layer provided in the optical semiconductor structure and including high resistance regions having relatively high electrical resistance and low resistance regions having relatively low electrical resistance, wherein the high and low resistance regions are arranged in a period corresponding to the period in the second structural layer, and one of the electrodes is in contact with a portion of a surface of the current constriction structure.

14. The semiconductor light-emitting device according to claim 1, wherein the second light reflection structure has an optical reflectance higher than that of the first light reflection structure.

15. An optical semiconductor device comprising:
   one silicon substrate, and
   a semiconductor light-emitting device and a light-receiving device, which are provided on the silicon substrate,
   wherein the semiconductor light-emitting device comprises a first light reflection structure provided in contact with the silicon substrate, a buried layer made of silicon, being in contact with the silicon substrate, and surrounding the first light reflection structure, an optical semiconductor structure including an active layer, provided above the first light reflection structure, a second light reflection structure provided above the optical semiconductor structure, and a pair of electrodes which supply current to the optical semiconductor structure, wherein a surface of the first light reflection structure and a surface of the buried layer are included in the same plane, and a bottom layer of the optical semiconductor structure is in contact with the first light reflection structure and the buried layer,
   the semiconductor light-receiving device comprises an optical semiconductor structure including an active layer, provided on the silicon substrate, a first structural layer which is provided between the silicon substrate and the optical semiconductor structure, in which refractive index changes periodically and into which light is incident from a side of the substrate, a light reflection structure comprising a second structural layer whose refractive index changes periodically, provided above the optical semiconductor structure, and a pair of electrodes which apply a voltage to the optical semiconductor structure, and the optical semiconductor structure in the semiconductor light-emitting device and the optical semiconductor structure in the semiconductor light-receiving device have the same layer construction and are formed of the same semiconductor material.

16. The semiconductor light-emitting device according to claim 15, wherein the second light reflection structure has an optical reflectance higher than that of the first light reflection structure.

\* \* \* \* \*